United States Patent
Horio et al.

(10) Patent No.: US 8,770,352 B2
(45) Date of Patent: Jul. 8, 2014

(54) BRAKING SYSTEM

(75) Inventors: Masanobu Horio, Miyoshi (JP); Naotaka Nishida, Toyota (JP); Hiroshi Isono, Mishima (JP)

(73) Assignee: Toyota Jidosha Kabushiki Kaisha, Toyota (JP)

(*) Notice: Subject to any disclaimer, the term of this patent is extended or adjusted under 35 U.S.C. 154(b) by 389 days.

(21) Appl. No.: 13/129,529

(22) PCT Filed: Mar. 24, 2009

(86) PCT No.: PCT/JP2009/055806
§ 371 (c)(1),
(2), (4) Date: May 16, 2011

(87) PCT Pub. No.: WO2010/109592
PCT Pub. Date: Sep. 30, 2010

(65) Prior Publication Data
US 2012/0000737 A1   Jan. 5, 2012

(51) Int. Cl.
| | |
|---|---|
| *F16D 65/84* | (2006.01) |
| *H01L 35/32* | (2006.01) |
| *B60T 1/10* | (2006.01) |
| *F16D 65/092* | (2006.01) |
| *B60T 17/22* | (2006.01) |
| *F16D 61/00* | (2006.01) |
| *F16D 69/00* | (2006.01) |

(52) U.S. Cl.
CPC ............... *B60T 17/221* (2013.01); *H01L 35/32* (2013.01); *B60T 1/10* (2013.01); *F16D 65/84* (2013.01); *F16D 65/092* (2013.01); *F16D 2069/002* (2013.01); *F16D 61/00* (2013.01)
USPC ...................................... 188/71.6; 188/264 R

(58) Field of Classification Search
USPC ......... 188/18 A, 218 XL, 73.1, 250 R, 251 R, 188/71.6, 264 R
See application file for complete search history.

(56) References Cited

U.S. PATENT DOCUMENTS

| | | |
|---|---|---|
| 7,287,506 B1 | 10/2007 | Reiners et al. |
| 2006/0131117 A1 | 6/2006 | Pabst |

FOREIGN PATENT DOCUMENTS

| | | |
|---|---|---|
| EP | 1 595 103 B1 | 11/2005 |
| EP | 1 908 981 A1 | 4/2008 |
| JP | A-58-037329 | 3/1983 |
| JP | A-64-022657 | 1/1989 |
| JP | U-04-017527 | 2/1992 |
| JP | A-04-351333 | 12/1992 |
| JP | A-11-220804 | 8/1999 |

(Continued)

OTHER PUBLICATIONS

International Preliminary Report on Patentability issued in International Application No. PCT/JP2009/055806 issued Oct. 18, 2011.

(Continued)

*Primary Examiner* — Robert A Siconolfi
*Assistant Examiner* — Vu Q Nguyen
(74) *Attorney, Agent, or Firm* — Oliff PLC

(57) ABSTRACT

Provided is a braking system which can enhance the power generation efficiency of a thermoelectric conversion element by efficiently recovering the heat generated during braking, or by increasing the temperature difference between a heat source and the thermoelectric conversion element. A brake pad body in a brake pad is provided with a thermoelectric conversion element. The thermoelectric conversion element includes an n-type semiconductor layer and a p-type semiconductor layer. The n-type semiconductor layer and the p-type semiconductor layer are provided in a recess formed in the back surface of the brake pad body.

3 Claims, 18 Drawing Sheets

(56) References Cited

FOREIGN PATENT DOCUMENTS

| JP | A-2004-282851 | 10/2004 |
| JP | A-2008-69771 | 3/2008 |
| JP | A-2009-269469 | 11/2009 |
| WO | WO 2007/032801 A2 | 3/2007 |

OTHER PUBLICATIONS

International Search Report issued in International Application No. PCT/JP2009/055806 dated Apr. 21, 2009.

(a)   (b)

*Fig.3*
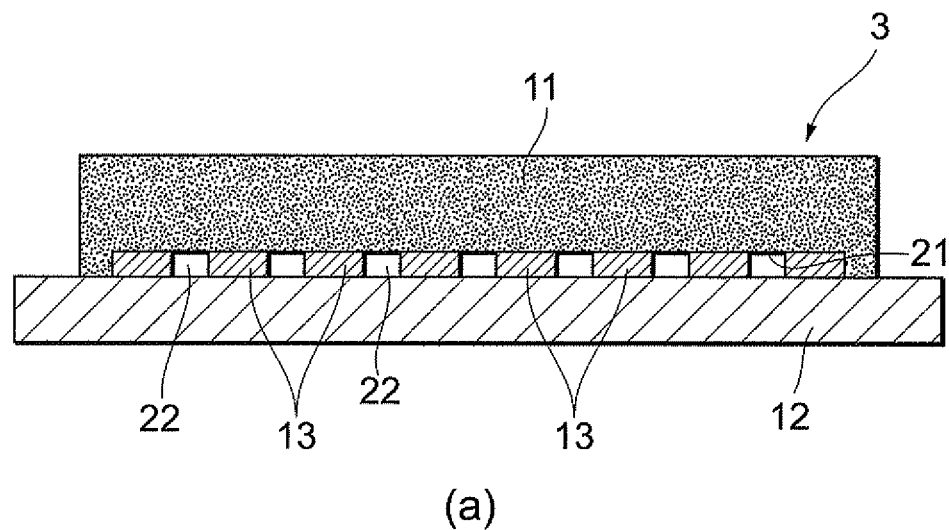
(a)
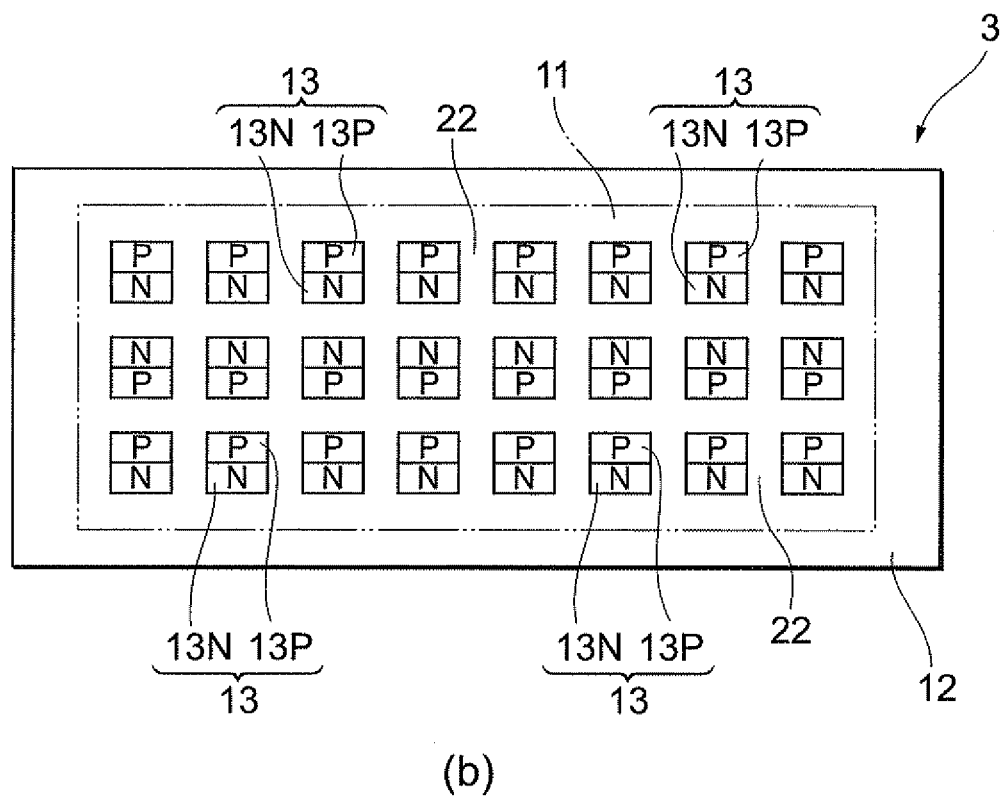
(b)

*Fig.4*
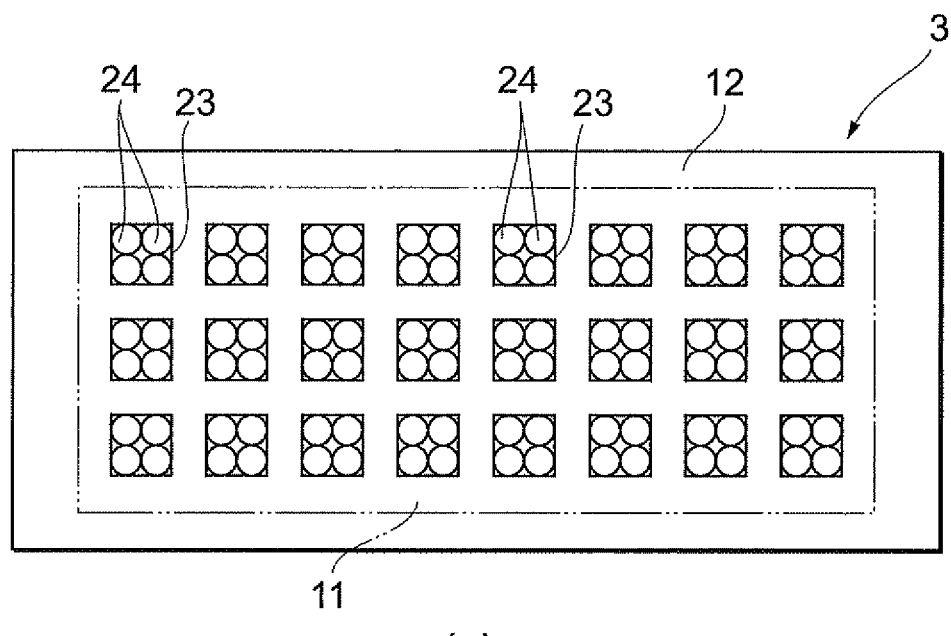
(a)
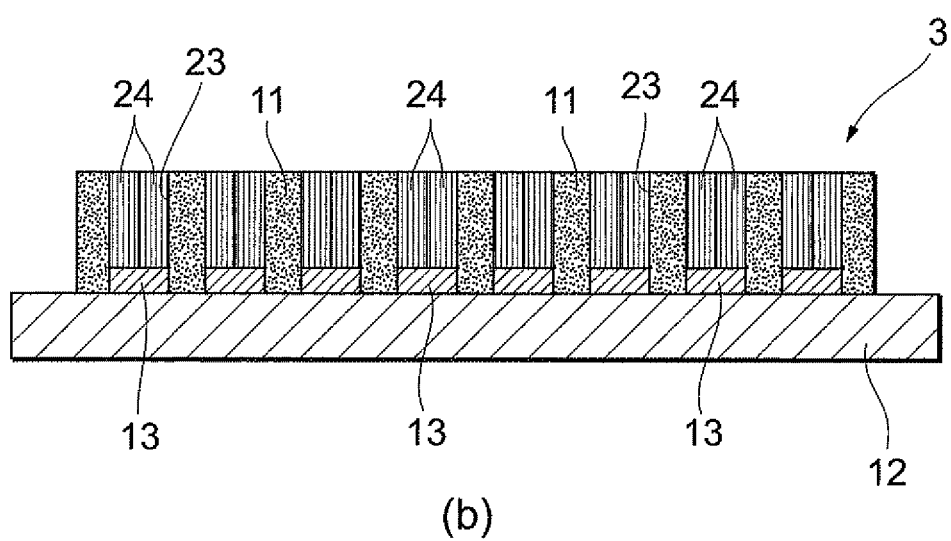
(b)

*Fig.7*
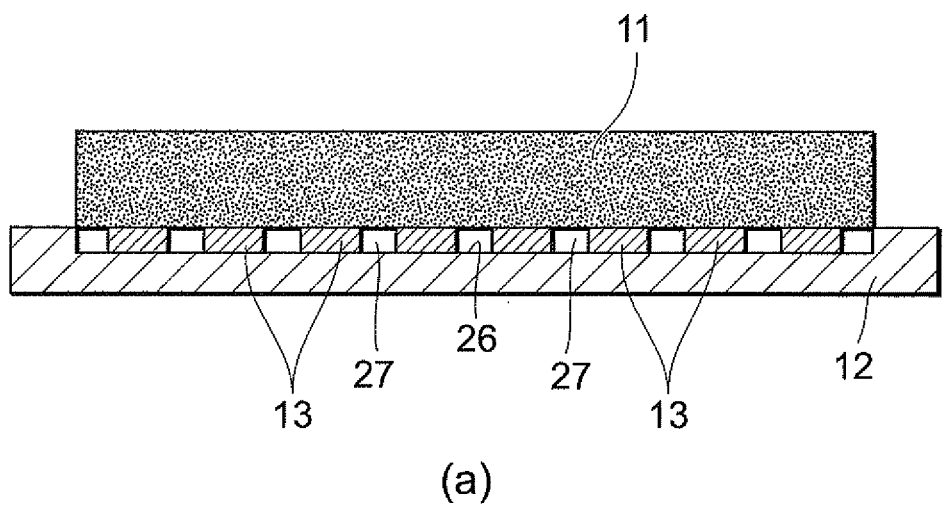
(a)
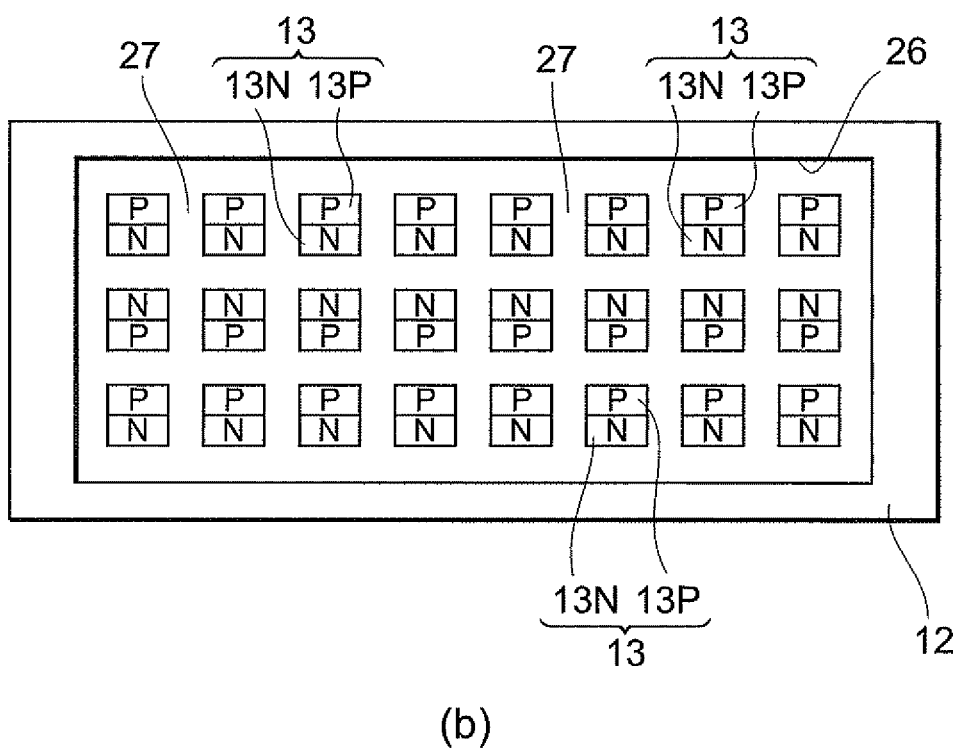
(b)

*Fig.8*
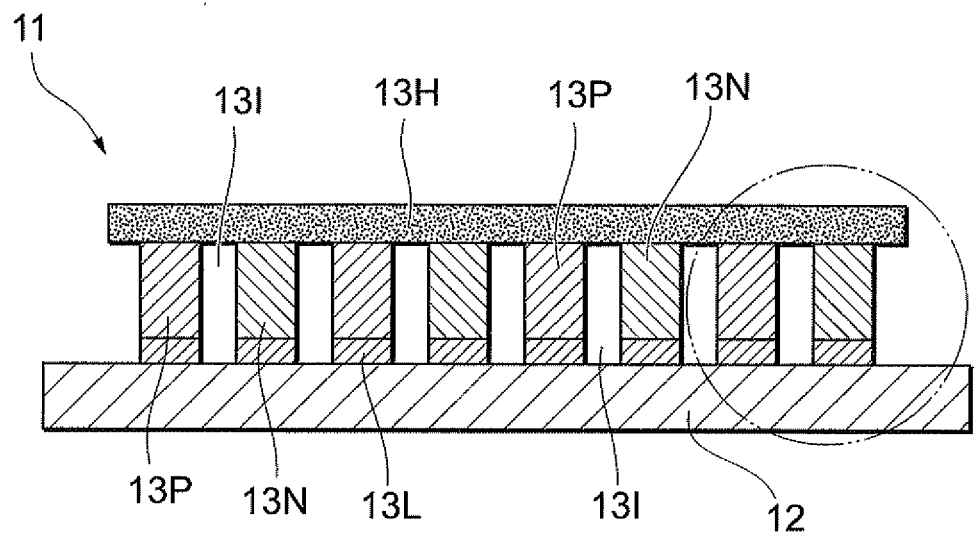
(a)
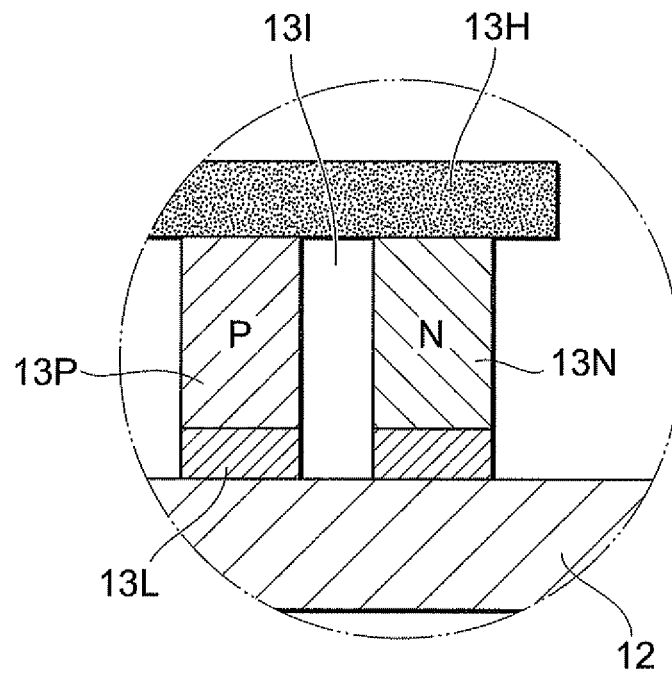
(b)

*Fig.9*
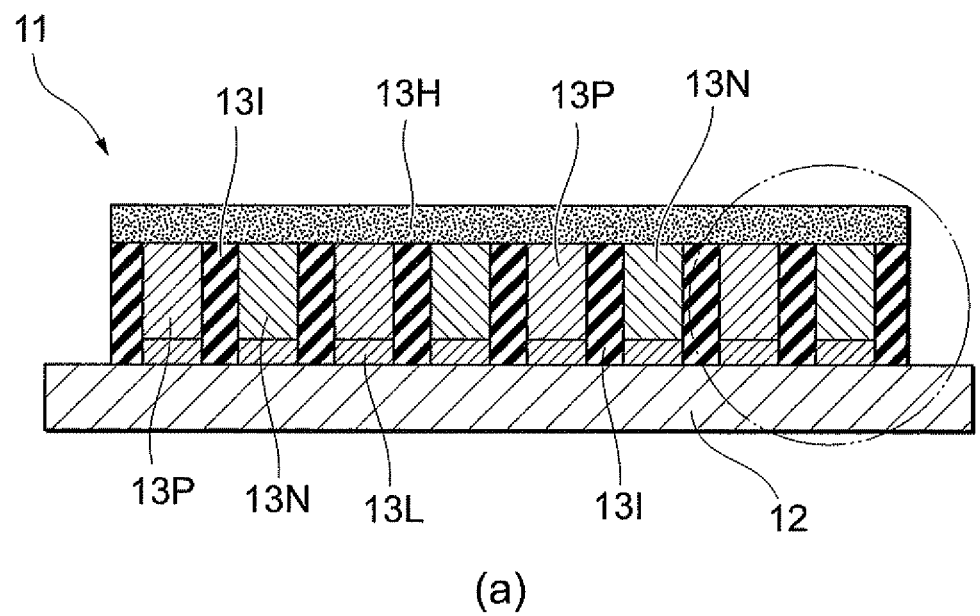
(a)
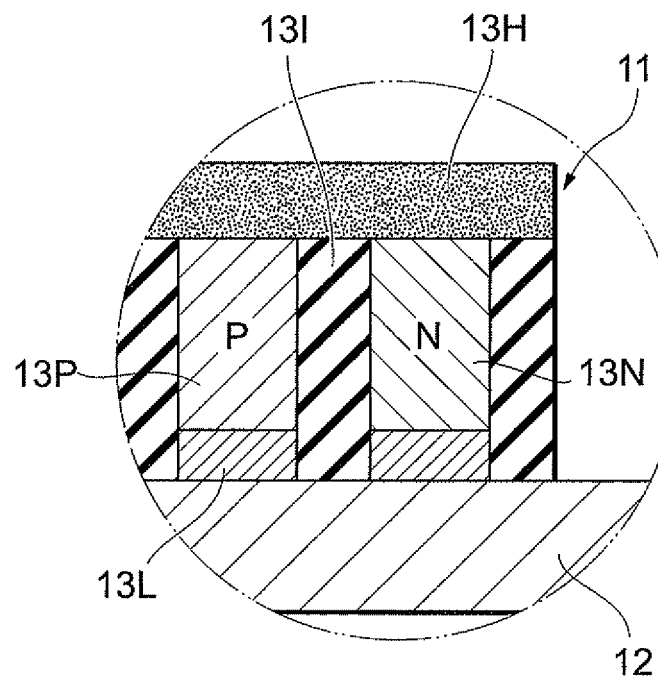
(b)

Fig.10
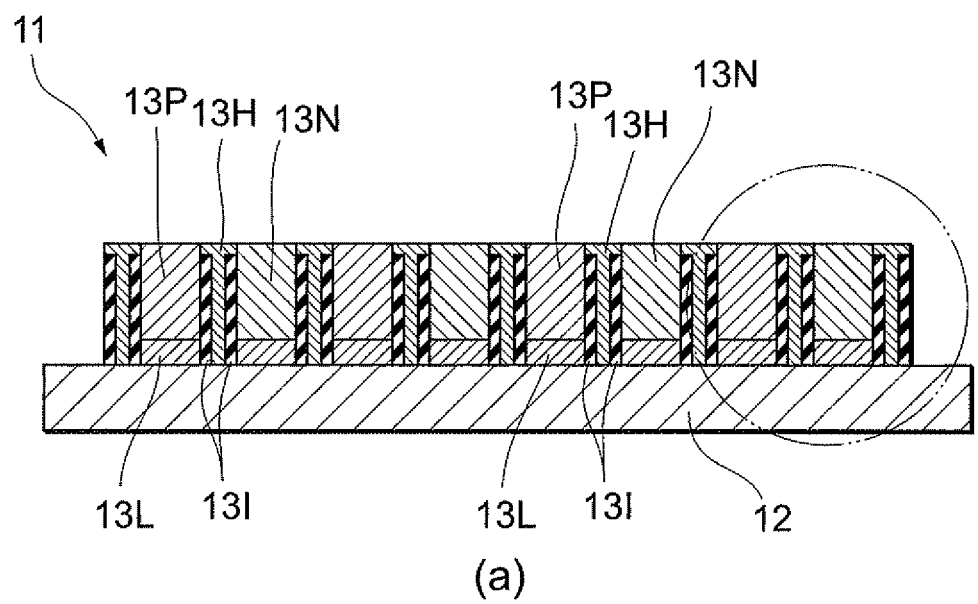
(a)
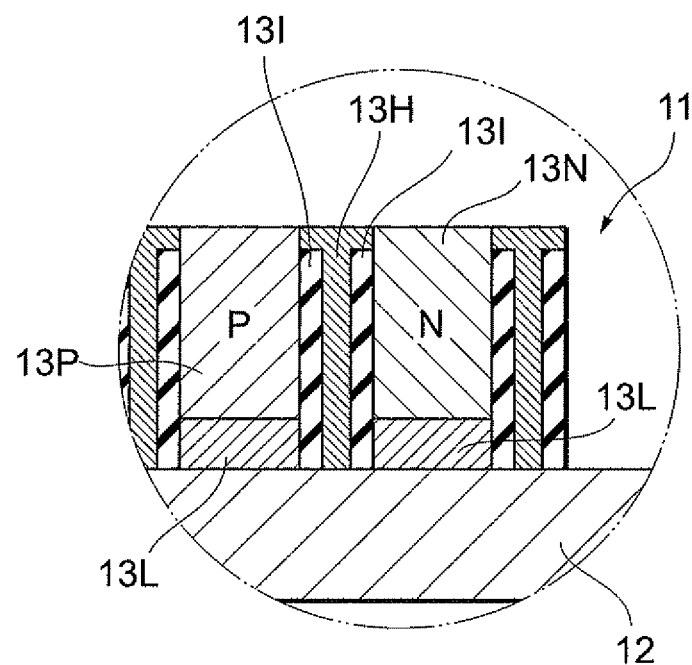
(b)

Fig.15
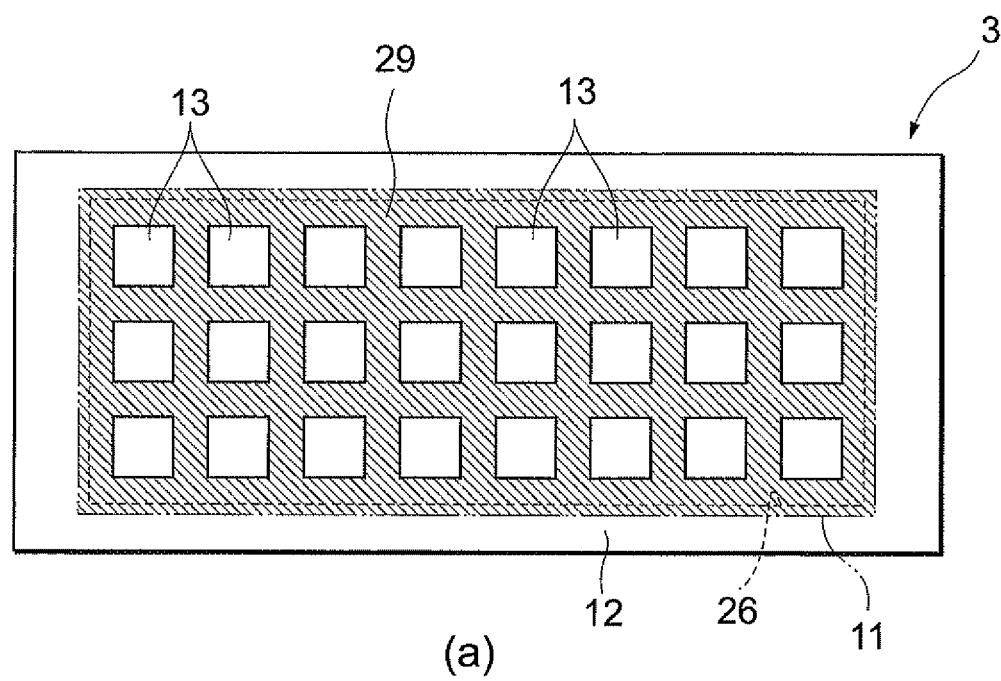
(a)
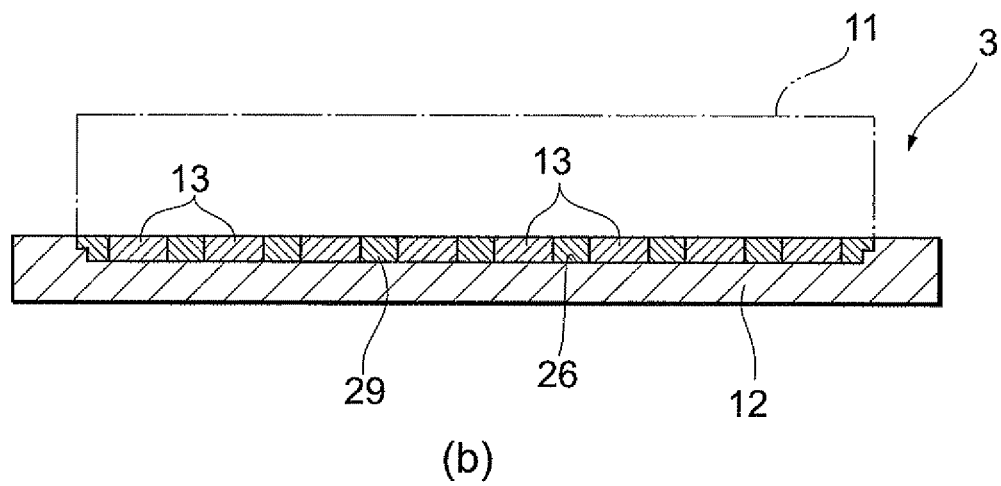
(b)

Fig.17
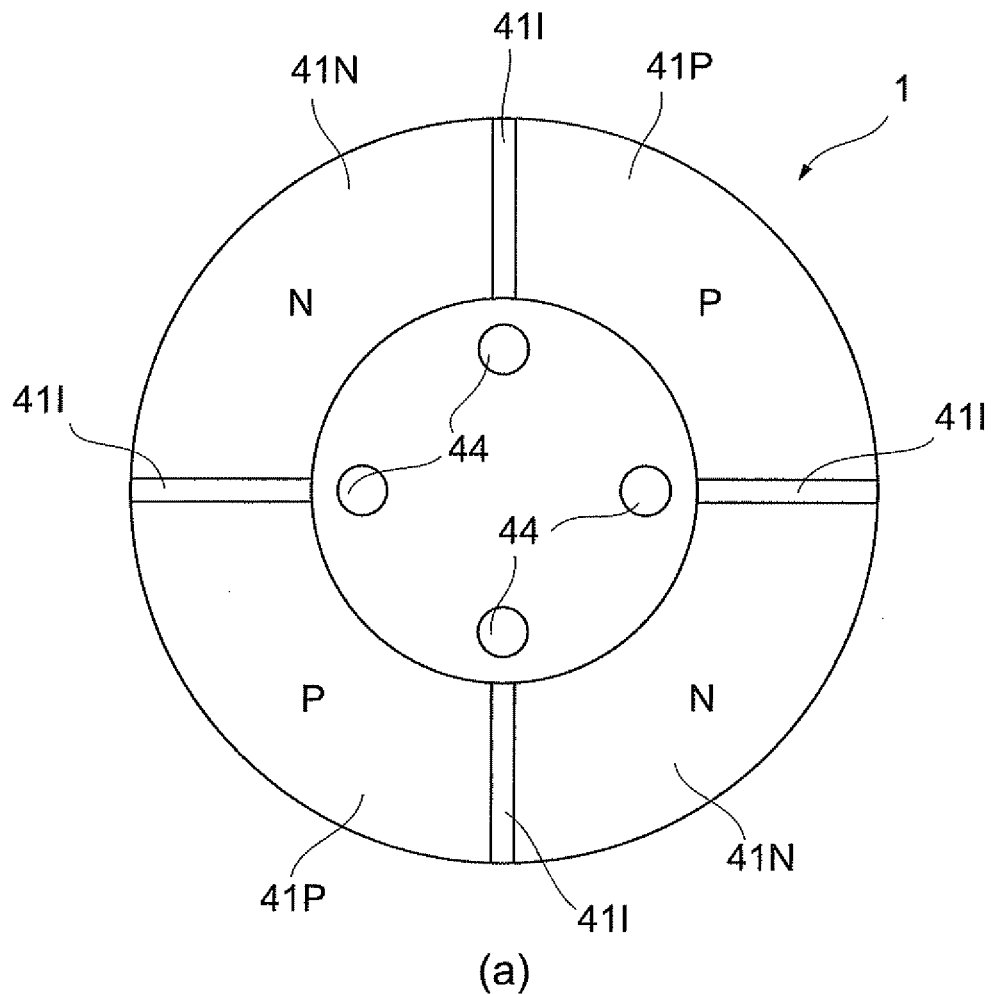
(a)
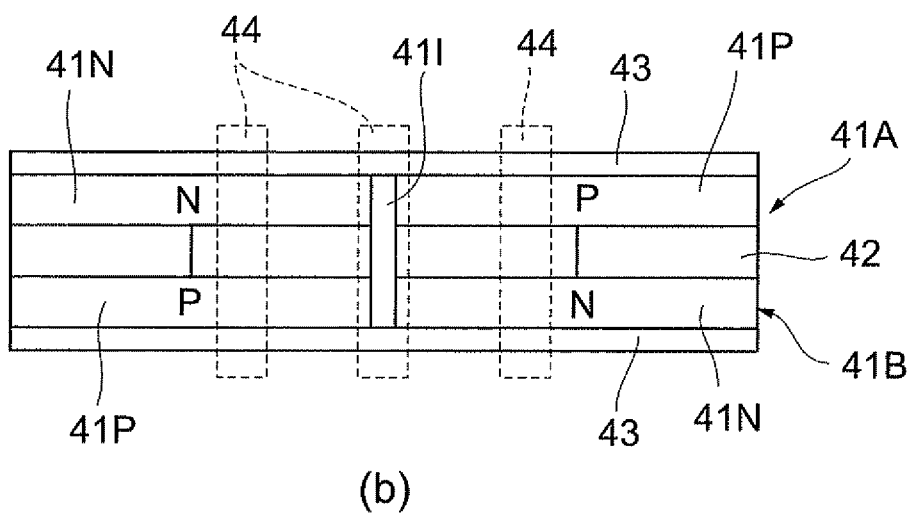
(b)

Fig.18
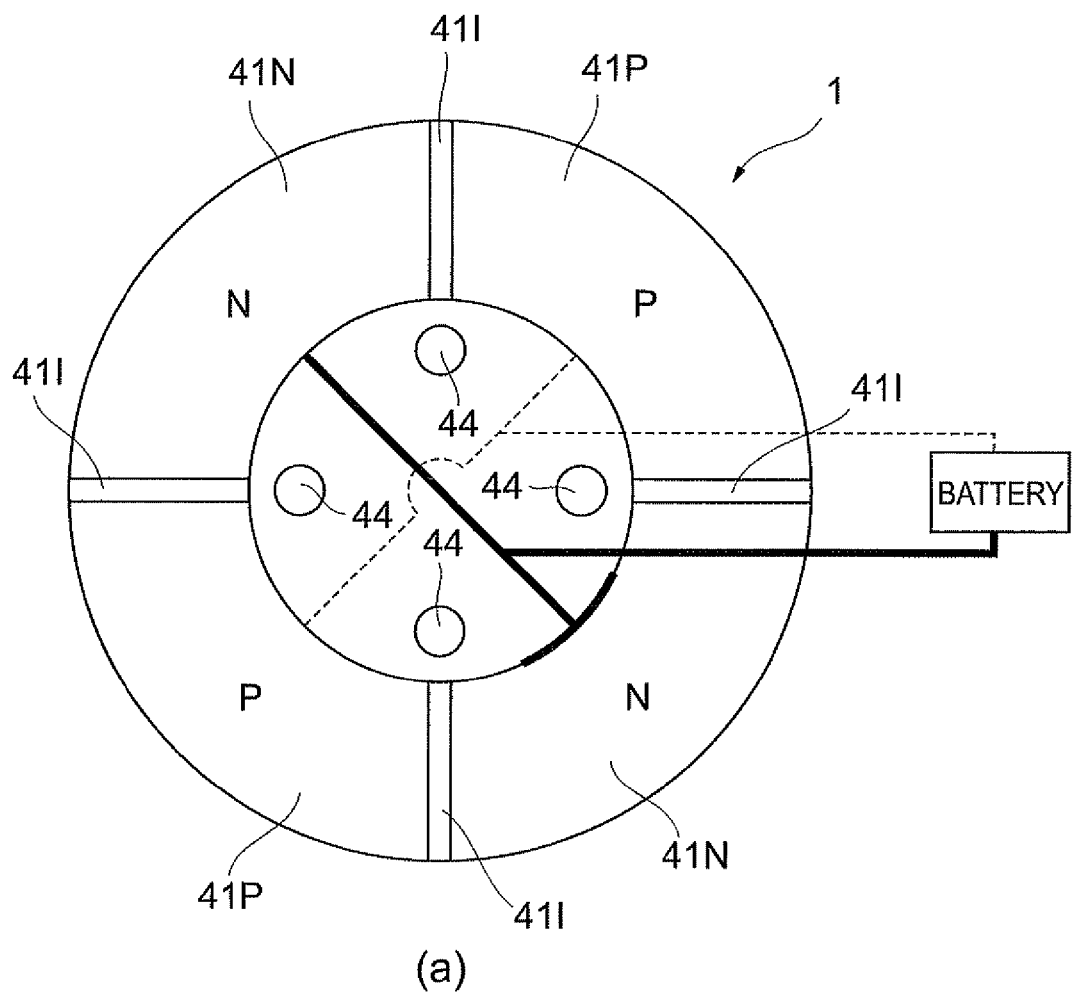
(a)
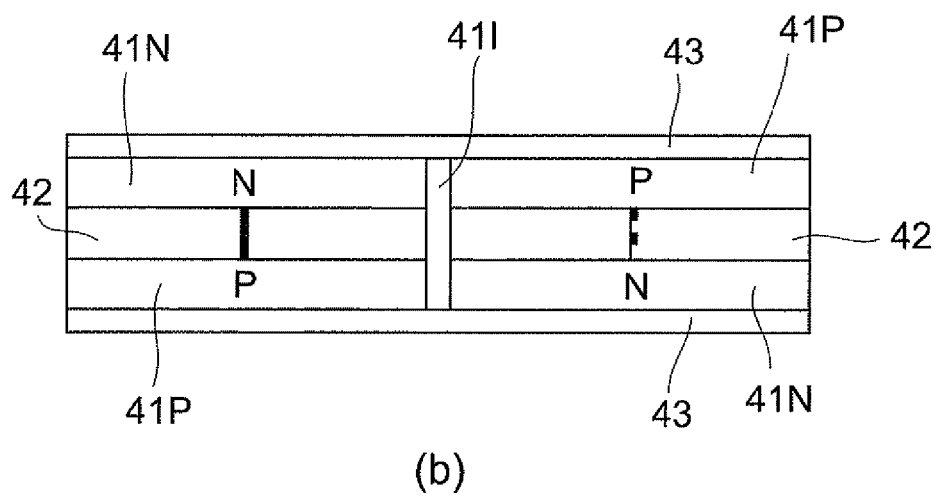
(b)

BRAKING SYSTEM

TECHNICAL FIELD

The present invention relates to a braking system, and particularly, to a braking system which can convert the heat obtained from the braking system into electricity appropriately.

BACKGROUND ART

In recent years, there has been known a braking system which recovers the heat generated in a brake of a vehicle and converts the heat into electrical energy for use. As such a braking system, there is a regenerative braking system (for example, refer to Japanese Unexamined Patent Application Publication No. 11-220804) which recovers the heat generated in the braking system and converts the heat into electricity using thermoelectric conversion elements. This regenerative braking system connects a brake caliper and the thermoelectric conversion elements using heat pipes, and transmits the heat in the brake caliper to the thermoelectric conversion elements through the heat pipes.

SUMMARY OF INVENTION

Technical Problem

However, in the regenerative braking system disclosed in the above Japanese Unexamined Patent Application Publication No. 11-220804, the brake caliper and the thermoelectric conversion elements are connected through the heat pipes, thereby performing heat recovery. For this reason, the quantity of heat which disappears in the process of performing heat transfer increases. Accordingly, there is room for improvement in the power generation efficiency of the thermoelectric conversion elements by improvement in heat recovery efficiency.

Moreover, in the thermoelectric conversion elements, the power generation efficiency can be improved as a temperature difference between a heat source and the thermoelectric conversion elements is larger. However, in the regenerative braking system disclosed in the above Japanese Unexamined Patent Application Publication No. 11-220804, the temperature difference between the heat source and the power generation conversion elements is not taken into consideration, and there is also room for improvement in the power generation efficiency of the thermoelectric conversion element from that viewpoint.

Thus, the object of the invention is to provide a braking system which can enhance the power generation efficiency of a thermoelectric conversion element by efficiently collecting heat generated during braking, or by increasing the temperature difference between a heat source and the thermoelectric conversion element.

Solution to Problem

In order to solve the above problems, the invention provides a braking system including a rotor member attached to a rotating body; a sliding member which brakes the rotation of the rotating body via the rotor member as the sliding member is brought into sliding contact with the rotor member; and a movable member which moves the sliding member in the direction of the rotor member. At least one of the rotor member and the sliding member is provided with a thermoelectric conversion element.

In the braking system related to the invention, at least one of the rotor member and the sliding member is provided with a thermoelectric conversion element. In the braking system, as the sliding member slides relative to the rotor member, heat is generated. For this reason, as at least one of the rotor member and the sliding member is provided with the thermoelectric conversion element, the heat generated during braking can be efficiently collected, and as the heat recovery efficiency is improved, the power generation efficiency of the thermoelectric conversion element can be improved.

Here, it is possible to adopt an aspect in which the sliding member includes a sliding member body which comes into contact with the rotor member, and an interposing member which attaches the sliding member body to the movable member, the thermoelectric conversion element is arranged on the interposing member side in the sliding member body, and a heat transfer member is provided between the surface of the sliding member body on the side of the rotor member, and the thermoelectric conversion element.

As the heat transfer member is provided between the surface of the sliding member body on the side of the rotor member, and the thermoelectric conversion element in this way, the heat generated when the sliding member slides on the rotor member can be efficiently transferred to the thermoelectric conversion element.

Additionally, it is possible to adopt an aspect in which the heat transfer member is a carbon nanotube.

The carbon nanotube includes high heat conductivity and durability. For this reason, the carbon nanotube can be appropriately used as the heat transfer member.

Moreover, it is possible to adopt an aspect in which a space for disposing the heat transfer member is formed in the sliding member body, an outer peripheral portion of the heat transfer member is formed with a high $\mu$ material layer, and the heat transfer member formed with the high $\mu$ material layer is disposed in the space.

Although the rate of heat absorption and recovery of the thermoelectric conversion element can be achieved by providing the heat transfer member, a decrease in the frictional force between the rotor member and the sliding member is a cause for concern. In this regard, as the outer peripheral portion of the heat transfer member is formed with the high $\mu$ material layer, a decrease in the frictional force between the rotor member and the sliding member can be suppressed.

Additionally, it is possible to adopt an aspect in which a space for disposing the heat transfer member is formed in the sliding body member, an outer peripheral portion of the heat transfer member is formed with a heat insulating material layer, and the heat transfer member formed with the heat insulating material layer is disposed in the space.

As the outer peripheral portion of the heat transfer member is formed with the heat insulating material layer in this way, heat can be prevented from being diffused toward the outer periphery from the heat transfer member. As a result, the heat recovery efficiency can be further improved, and the power generation efficiency of the thermoelectric conversion element can be improved.

Moreover, it is possible to adopt an aspect in which the sliding member includes a sliding member body which comes into contact with the rotor member, and an interposing member which attaches the sliding member body to the movable member, a recess is formed in the surface of the interposing member on the side of the heat insulation member body, and the thermoelectric conversion element is disposed in the recess.

As the thermoelectric conversion element is disposed in the recess formed on the surface of the interposing member on the side of the heat insulation member body, the short-circuiting of a base in a case where damage or submersion of the thermoelectric conversion element caused by a braking force during braking has occurred or the generation of rust can be prevented.

Additionally, it is possible to adopt an aspect in which the sliding member includes a sliding member body which comes into contact with the rotor member, and an interposing member which attaches the sliding member body to the movable member, and the sliding member body is the thermoelectric conversion element.

As the sliding member body is the thermoelectric conversion element in this way, recovery of heat can be performed at a position nearer a heat source during braking. Therefore, the heat recovery efficiency can be made higher, and the power generation efficiency of the thermoelectric conversion element can be improved.

At this time, it is possible to adopt an aspect in which the sliding member body includes, toward the rotor member side from the interposing member side, a first layer in which a low-temperature-side electrode layer, an n-type semiconductor layer, and a high-temperature-side layer are laminated in this order, and a second layer in which a low-temperature-side electrode layer, a p-type semiconductor layer, and a high-temperature-side electrode layer are laminated in this order, the high-temperature-side electrode layer constitutes a friction material which comes into contact with the rotor member, and an insulating layer is formed between the first layer and the second layer.

As the sliding member body is configured in this way, the sliding member body can be appropriately used as the thermoelectric conversion element.

Alternatively, it is possible to adopt an aspect in which the sliding member includes a sliding member body which comes into contact with the rotor member, and an interposing member which attaches the sliding member body to the movable member, the sliding member body includes, toward the rotor member side from the interposing member side, a first layer in which a low-temperature-side electrode layer and an n-type semiconductor layer are laminated in this order, and a second layer in which a low-temperature-side electrode layer and a p-type semiconductor layer are laminated in this order, and an electrode layer is provided between the first layer and the second layer, the electrode layer includes a vertically extending portion which extends toward the rotor member side from the interposing member side, and an upper end piece portion which is provided at the end of the vertically extending portion on the side of the rotor member to electrically connect the n-type semiconductor layer and the p-type semiconductor layer, and the upper end piece portion is exposed to the rotor member side, and an insulating layer is formed between the n-type semiconductor layer and the vertically extending portion and between the p-type semiconductor layer and the vertically extending portion, on the interposing member side in the upper end piece portion in the electrode layer.

As the upper end piece portion in the electrode layer is exposed to the rotor member side in this way, dust of the electrode layer is covered on the insulating layer due to a frictional force when the rotor member and the sliding member slide on each other. As a result, since the upper end piece portion functions as a high-temperature-side electrode of the thermoelectric conversion element, the upper end piece portion in the electrode layer can be made into a thin layer. As the upper end piece portion in the electrode layer can be made into a thin layer in this way, the thermoelectric conversion element can be arranged at a position nearer a heat source which generates heat when the sliding member slides on the rotor member. Therefore, the heat recovery efficiency can be made higher, and the power generation efficiency of the thermoelectric conversion element can be improved.

Additionally, it is possible to adopt an aspect in which the insulating layer is formed from a reinforcing material compounding insulator.

As the insulating layer is formed from the reinforcing material compounding insulator in this way, the thermoelectric conversion element can be prevented from being damaged due to compression, a shear force, or the like which is generated during braking.

Moreover, it is possible to adopt an aspect in which the sliding member body includes a plurality of thermoelectric conversion parts including the first layer, the second layer, and the insulating layer, and the plurality of thermoelectric conversion parts is provided side by side to form the thermoelectric conversion element.

As the plurality of thermoelectric conversion elements is provided side by side, the heat recovery efficiency can be made higher.

Additionally, it is possible to adopt an aspect in which an n-type semiconductor layer and a p-type semiconductor layer in the thermoelectric conversion element are formed on the contact surface of the sliding member with the rotor member via an insulating layer, and a high-temperature-side electrode in the thermoelectric conversion element is provided on the contact surface of the rotor member with the sliding member.

As the high-temperature-side electrode in the thermoelectric conversion element is provided on the contact surface of the rotor member with the sliding member, it becomes unnecessary to provide the sliding member with the high-temperature-side electrode. Accordingly, the configuration of the sliding member can be made simple to that extent.

Moreover, it is possible to adopt an aspect in which the sliding member includes a first sliding member and a second sliding member, the first sliding member and the second sliding member are respectively disposed at mutually facing positions with the rotor member interposed therebetween, and the n-type semiconductor layer in the first sliding member is arranged at a position where the rotor member faces the p-type semiconductor layer in the second sliding member, and the p-type semiconductor layer in the first sliding member is arranged at a position where the rotor member faces the n-type semiconductor layer in the second sliding member.

In this way, the p-type semiconductor layer in the first sliding member is arranged at a position where the rotor member faces the n-type semiconductor layer in the second sliding member, and the n-type semiconductor layer in the first sliding member is arranged at a position where the rotor member faces the p-type semiconductor layer in the second sliding member. Thereby, the frictional resistance becomes equal between the sliding members which face each other via the rotor. Accordingly, the occurrence of problems, such as partial wear of the sliding members, and deterioration of brake balance, can be avoided.

Additionally, it is possible to adopt an aspect in which a plurality of the thermoelectric conversion elements is disposed in the recess, and refrigerant channels are formed between the plurality of thermoelectric conversion elements.

As the refrigerant channels are formed between the plurality of thermoelectric conversion elements in this way, the thermoelectric conversion elements can be cooled. By cooling the thermoelectric conversion elements, a temperature difference between a heat source which generates heat when the sliding member slide on the rotor member, and the thermoelectric conversion elements can be increased. As a result, the power generation efficiency of the thermoelectric conversion elements can be made higher.

Moreover, it is possible to adopt an aspect in which the thermoelectric conversion elements have a tapered shape whose diameter is reduced toward the interposing member side from the sliding member body side.

As the thermoelectric conversion elements have a tapered shape whose diameter is reduced toward the interposing member side from the sliding member body side, the area of the portions of the thermoelectric conversion elements which receive heat generated when the sliding member slides on the rotor can be increased. For this reason, the heat recovery efficiency can be made higher.

Alternatively, it is possible to adopt an aspect in which a plurality of the thermoelectric conversion elements is disposed in the recess, and a heat insulating layer is formed between the plurality of thermoelectric conversion elements.

As the heat insulating layer is formed between the plurality of thermoelectric conversion elements, diffusion or heat dissipation of the heat from the thermoelectric conversion elements can be suppressed. Accordingly, the power generation efficiency of the thermoelectric conversion elements can be made higher.

Additionally, it is possible to adopt an aspect in which the interposing member is provided with a cooling member.

As the interposing member is provided with the cooling member, the thermoelectric conversion elements can be appropriately cooled. For this reason, a temperature difference between a heat source which generates heat when the sliding member slides on the rotor member, and the thermoelectric conversion elements can be increased. As a result, the power generation efficiency of the thermoelectric conversion elements can be made higher.

Moreover, it is possible to adopt an aspect in which the rotor member is formed with an n-type semiconductor layer and a p-type semiconductor layer in the thermoelectric conversion element.

As the rotor member is formed with an n-type semiconductor layer and a p-type semiconductor layer in the thermoelectric conversion element in this way, the thermoelectric conversion elements can be arranged at positions near a heat source which generates heat when the sliding member slides on the rotor member. Therefore, the heat recovery efficiency can be made higher.

Also, it is possible to adopt an aspect in which the n-type semiconductor layer and the p-type semiconductor layer are disposed alternately along the circumferential direction of the rotor member, and an insulating layer is formed between the n-type semiconductor layer and the p-type semiconductor layer.

As the semiconductor layers are disposed alternately along the circumferential direction of the rotor member, and an insulating layer is formed between the n-type semiconductor layer and the p-type semiconductor layer, the frictional resistance in the sliding member becomes equal in the circumferential direction of the rotor member. Accordingly, the occurrence of problems, such as partial wear of the sliding members, and deterioration of brake balance, can be avoided.

Advantageous Effects of Invention

According to the braking system related to the invention, it is possible to enhance the power generation efficiency of the thermoelectric conversion element by efficiently collecting heat generated during braking, or by increasing the temperature difference between the heat source and the thermoelectric conversion element.

BRIEF DESCRIPTION OF DRAWINGS

FIG. 1A is a side view, and FIG. 1B is a front view.

FIG. 2A is a side view, and FIG. 2B is a front view.

FIG. 3A is a front sectional view of a brake pad in a braking system related to the first embodiment, and FIG. 3B is a plan view thereof.

FIG. 4A is a plan view of a brake pad in a braking system related to a second embodiment, and FIG. 4B is a side sectional view thereof.

FIG. 7A is a plan view of a brake pad in a braking system related to a fifth embodiment, and FIG. 7B is a side sectional view thereof.

FIG. 8A is a side sectional view of a brake pad in a braking system related to a sixth embodiment, and FIG. 8B is an enlarged side sectional view thereof.

FIG. 9A is a side sectional view of a brake pad in a braking system related to a seventh embodiment, and FIG. 9B is an enlarged side sectional view thereof.

FIG. 10A is a side sectional view of a brake pad in a braking system related to an eighth embodiment, and FIG. 10B is an enlarged side sectional view thereof.

FIG. 15A is a plan view of a brake pad in a braking system related to a thirteenth embodiment, and FIG. 15B is a side sectional view thereof.

FIG. 17A is a front sectional view of a rotor in a braking system related to a fifteenth embodiment of the invention, and FIG. 17B is a plan sectional view thereof.

FIG. 18A is a front sectional view schematically showing an electric circuit in the braking system related to the fifteenth embodiment of the invention, and FIG. 18B is a plan sectional view.

REFERENCE SIGNS LIST

Figure 1:
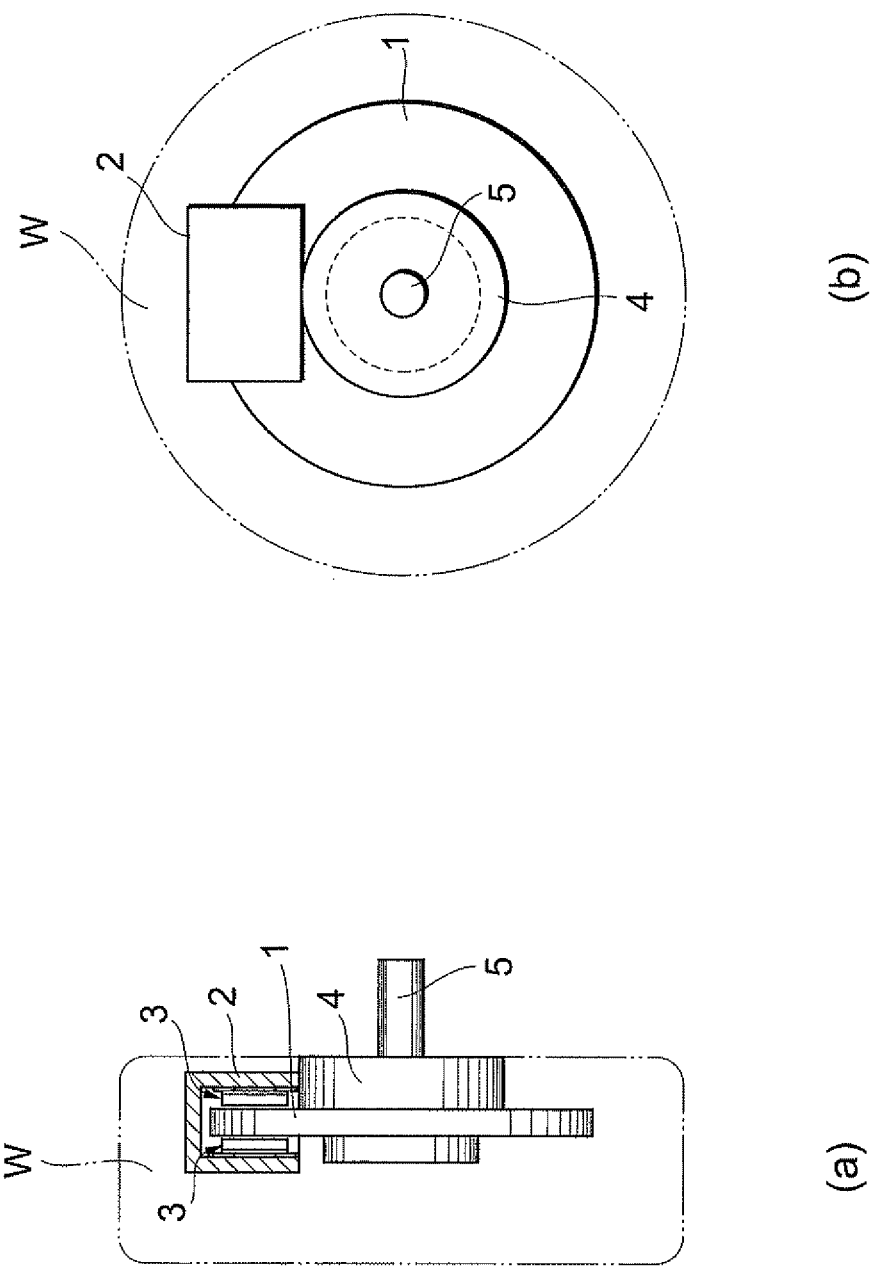
FIGS. 1A and 1B are views showing the outline of a braking system related to an embodiment of the invention.

1: ROTOR
2: BRAKE CALIPER
3: BRAKE PAD
4: HUB BEARING
5: AXLE
11: BRAKE PAD BODY

12: BACK METAL
13: THERMOELECTRIC CONVERSION ELEMENT
13N: n-TYPE SEMICONDUCTOR LAYER
13P: p-TYPE SEMICONDUCTOR LAYER
13H: HIGH-TEMPERATURE-SIDE ELECTRODE LAYER
13I: HEAT INSULATING LAYER
13L: LOW-TEMPERATURE-SIDE ELECTRODE LAYER
21: RECESS
22: VOID
23: THROUGH HOLE
24: HEAT CONDUCTION PIPE
24A: CONDUCTION PIPE BODY
24B: HIGH μ LAYER
5: HEAT CONDUCTION PIPE
25A: CONDUCTION PIPE BODY
25B: HIGH μ LAYER
25C: HEAT INSULATING LAYER
26: BACK METAL RECESS
27: VOID
28: AIR-COOLING GROOVE
29: HEAT INSULATING LAYER
31: PISTON MEMBER
32: BACK PLATE
33: WATER
34: SEAL MEMBER
41: THERMOELECTRIC CONVERSION ELEMENT
41A: FIRST THERMOELECTRIC CONVERSION ELEMENT
41B: SECOND THERMOELECTRIC CONVERSION ELEMENT
41N: n-TYPE SEMICONDUCTOR ELEMENT
41P: p-TYPE SEMICONDUCTOR ELEMENT
41I: INSULATING LAYER
42: INSULATING MEMBER
43: FRICTION PLATE
44: FASTENING MEMBER
W: WHEEL

DESCRIPTION OF EMBODIMENTS

Hereinafter, embodiments of the invention will be described with reference to the accompanying drawings. In addition, in the description of the drawings, the same reference numerals will be given to the same elements, and duplicate description will be omitted. Additionally, for convenience of illustration, the dimension scales of the drawings do not necessarily coincide with those described.

FIGS. 1A and 1B are views showing the outline of a braking system related to an embodiment of the invention, FIG. 1A is a side view, and FIG. 1B is a front view. FIGS. 2A and 2B are views showing the outline of a brake pad, FIG. 2A is a side view, and FIG. 2B is a front view. As shown in FIG. 1, the braking system related to the present embodiment is provided in a wheel W, and includes a rotor 1. A brake caliper 2 is provided above the rotor 1 on the value side of the wheel W.

The brake caliper 2 opens downward, and includes two plate-shaped movable parts which move in a direction along the rotational axis of the rotor 1. Brake pads 3 which are sliding members are respectively attached to the inner surfaces of these grippers. Additionally, the rotor 1 is connected to an axle 5 via a hub bearing 4. As the rotational force of the axle 5 is transmitted to the wheel W in this way, the wheel W rotates, and the rotor 1 also rotates with the rotation of the wheel W.

The movable parts in the brake caliper 2 move relatively with a mutual center plane as an axis, and when the movable parts move inward, the brake pads 3 comes into contact with the rotor 1 and the brake pads 3 slide relative to the rotor 1. At this time, a frictional force is generated between the brake pads 3 and the rotor 1 by the sliding of the brake pads 3 relative to the rotor, and this frictional force becomes a braking force, and consequently the braking force is imparted to the rotor 1 and the wheel W. Additionally, when the movable parts in the brake caliper 2 move outward, the brake pads 3 are separated from the rotor 1. As the brake pads 3 are separated from the rotor 1, the frictional force disappears and the braking force also disappears.

Each brake pad 3, as shown also in FIGS. 2A and 2B, includes a brake pad body 11, and a back metal 12. The brake pad body 11 is made of, for example, a hard material, and is provided on the rotor 1 side.

Additionally, the back metal 12 is disposed between the brake pad body 11 and the brake caliper 2. The brake pad body 11 is attached to the brake caliper 2 via the back metal 12. Hereinafter, the surface of the brake pad body 11 on which the back metal 12 is provided is referred to as a back surface, and the surface which faces this back surface and which slides on the rotor 1 is referred to as a sliding surface.

Additionally, each brake pad 3 is provided with thermoelectric conversion elements 13 which convert the heat generated as the brake pad 3 slides on the rotor 1 into electricity. In the braking system, when the brake operates and each brake pad 3 slides on the rotor 1, the slide position between the rotor 1 and the brake pad 3 becomes a heat source, and consequently generates heat due to the frictional force between the rotor 1 and the brake pad 3. The heat generated here is recovered by the thermoelectric conversion elements 13, and is converted into electricity to generate electricity.

The thermoelectric conversion elements 13 are attached to the brake pad 3 in various aspects.

Figure 2:
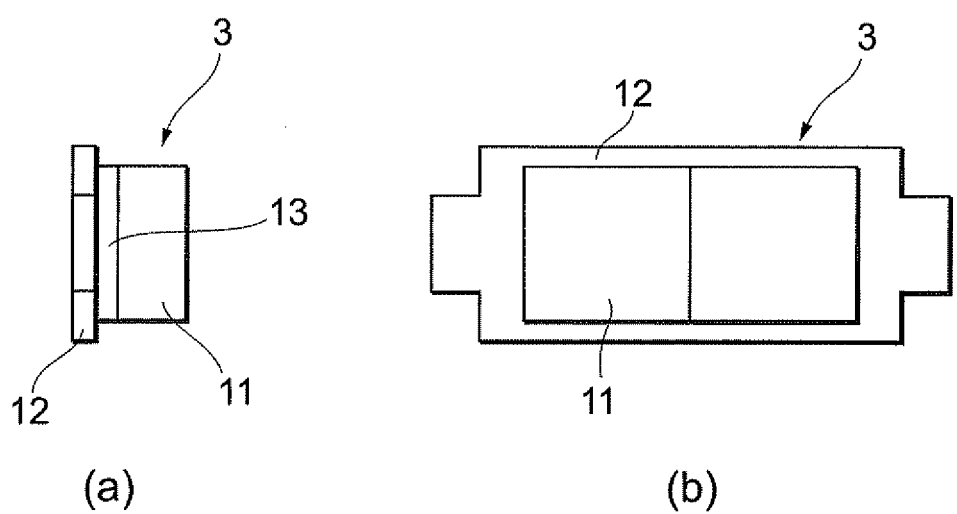
FIGS. 2A and 2B are views showing the outline of a brake pad.

In FIGS. 1 and 2, for the sake of convenience, the thermoelectric conversion elements 13 are interposed between the brake pad body 11 and the back metal 12. Hereinafter, specific examples of an attachment aspect of the thermoelectric conversion elements 13 will be described as respective embodiments.

First Embodiment

First, an attachment aspect of the thermoelectric conversion elements in a first embodiment of the invention will be described. FIG. 3A is a front sectional view of a brake pad in a braking system related to the first embodiment, and FIG. 3B is a plan view thereof.

As shown in FIGS. 3A and 313, in the braking system related to the present embodiment, a recess 21 is formed in the back surface of the brake pad body 11 in the brake pad 3. A plurality of thermoelectric conversion elements 13 are provided in the recess 21, and the thermoelectric conversion elements 13 are provided inside the brake pad body 11. The plurality of thermoelectric conversion elements 13, as shown in FIG. 3B, is disposed in a matrix in plan view, and voids 22 are formed between the thermoelectric conversion elements 13.

The respective thermoelectric conversion elements 13 include a plurality of n-type semiconductor layers 13N and p-type semiconductor layers 13P, as shown in FIG. 3B. The plurality of n-type semiconductor layers 13N and p-type semiconductor layers 13P is connected in parallel to each other by conductive lines, respectively, and is connected to a battery (not shown).

In the braking system related to the present embodiment, the thermoelectric conversion elements 13 are provided inside the brake pad body 11. For this reason, the thermoelectric conversion elements 13 can be arranged at positions near the heat source. As a result, the heat recovery efficiency by the thermoelectric conversion elements when the brake is operated can be enhanced, and the power generation efficiency can be improved.

Second Embodiment

Next, an attachment aspect of the thermoelectric conversion elements in a second embodiment of the invention will be described. FIG. 4A is a plan view of a brake pad in a braking system related to the second embodiment, and FIG. 4B is a side sectional view thereof.

As shown in FIGS. 4A and 4B, a large number of through holes 23 are formed in the brake pad body 11 in the braking system related to the present embodiment. The through holes 23 pass through the brake pad body 11 between the back surface and sliding surface thereof. Additionally, a plurality of through holes 23 is arranged in a matrix in plan view, in the brake pad body 11.

The thermoelectric conversion elements 13 are disposed at the ends of the through holes 23 on the side of the back surface, and heat conduction pipes 24 which are heat transfer members are disposed closer to the side of the through holes 23 opposite to the back metal 12 than the thermoelectric conversion elements 13. The heat conduction pipes 24 are constituted by a carbon nanotube bundle formed by bundling a large number of carbon nanotubes. A through hole 23 is filled with a thermoelectric conversion element 13 and heat conduction pipes 24.

In the braking system related to the present embodiment, the thermoelectric conversion elements 13 are provided inside the brake pad body 11, and the heat conduction pipes 24 constituted by the carbon nanotube bundle are disposed between the sliding surface and the thermoelectric conversion elements 13 in the brake pad body 11. The carbon nanotubes are members which have a small thermal resistance and a high thermal conductivity.

For this reason, during braking, the heat emitted by the heat source, which is a position where each brake pad 3 slides on the rotor 1, can be conducted to the thermoelectric conversion elements 13 at high efficiency. As a result, the heat generated when the brake pad 3 slides on the rotor 1 can be efficiently transferred to the thermoelectric conversion elements. As a result, the heat recovery efficiency by the thermoelectric conversion elements when the brake is operated can be further enhanced, and the power generation efficiency can be improved.

Moreover, the carbon nanotubes have high durability. For this reason, the carbon nanotubes can be kept on being used as the heat conduction pipes, without increasing degradation of the function, even in a case where the brake pad 3 is used for a prolonged period of time.

Third Embodiment

Figure 5:
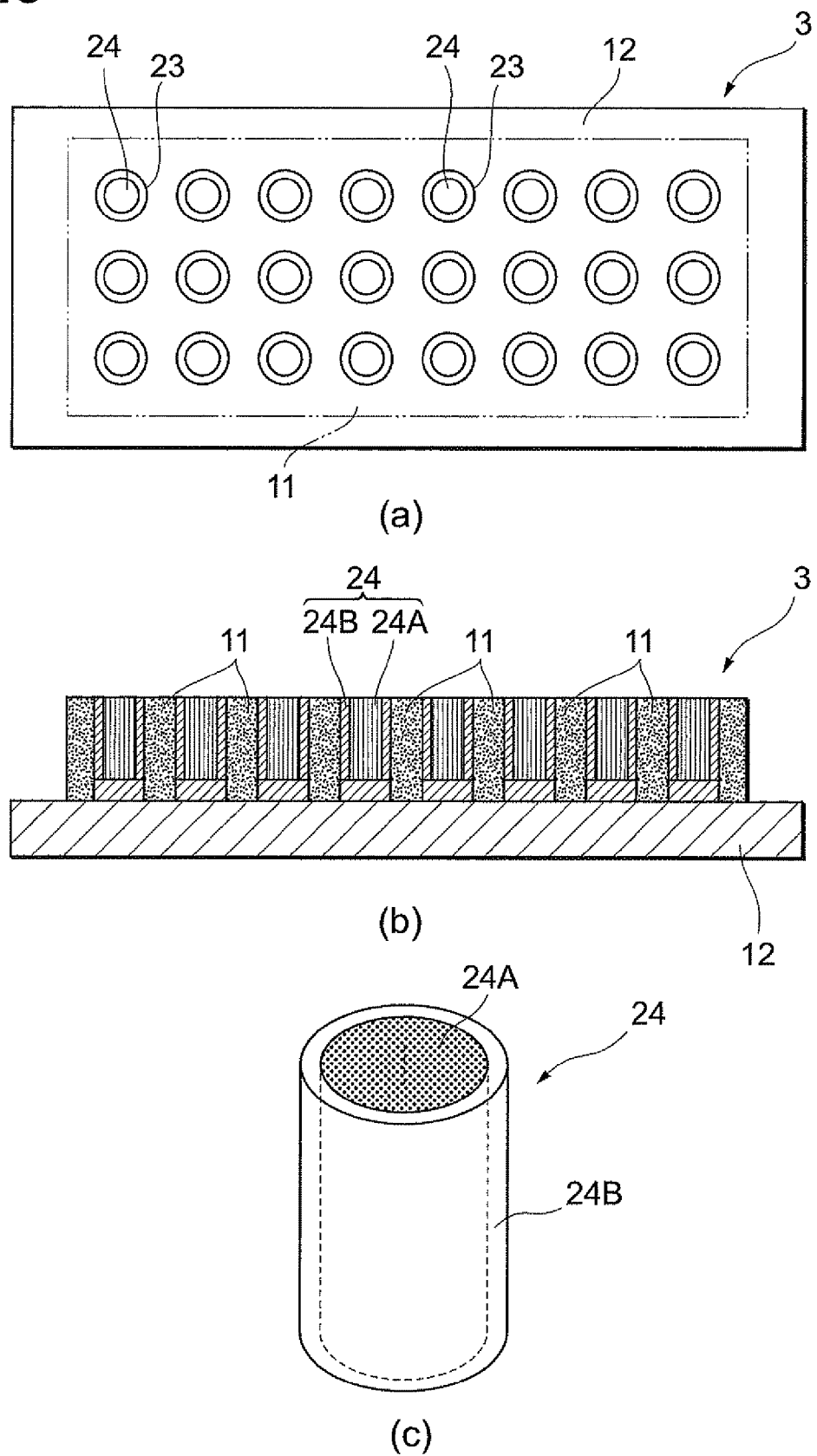
FIG. 5A is a plan view of a brake pad in a braking system related to a third embodiment.
FIG. 5B is a side sectional view thereof.
FIG. 5C is a perspective view of a heat conduction pipe.

Subsequently, an attachment aspect of the thermoelectric conversion elements in a third embodiment of the invention will be described. FIG. 5A is a plan view of a brake pad in a braking system related to a third embodiment, FIG. 5B is a side sectional view thereof, and FIG. 5C is a perspective view of a heat conduction pipe.

As shown in FIGS. 5A and 5B, in the braking system related to the present embodiment, similarly to the second above embodiment, a large number of through holes 23 which pass through the brake pad body between the back surface and sliding surface thereof are formed and arranged in a matrix in the brake pad body 11. The thermoelectric conversion elements 13 are disposed at the ends of the through holes 23 on the side of the back surface, and the heat conduction pipes 24 which are heat transfer members are disposed closer to the side of the through holes 23 opposite to the back metal 12 than the thermoelectric conversion elements 13.

Each heat conduction pipe 24, as shown in FIG. 5C, includes a conduction pipe body 24A consisting of a carbon nanotube bundle. The outer peripheral portion of the conduction pipe body 24A is formed with a high μ layer 24B. The high μ layer 24B is made of a high μ-property material. As the high μ-property material, metal oxides represented by, for example, $SiO_2$, $Al_2O_3$, and the like can be illustrated.

In the braking system related to the present embodiment, similarly to the second above embodiment, since the heat conduction pipes 24 are disposed between the sliding surface and the thermoelectric conversion elements 13 in the brake pad body 11, the heat emitted in the heat source can be conducted to the thermoelectric conversion elements 13 at high efficiency.

Additionally, when the heat conduction pipes are provided, a decrease in the frictional force in the brake pad body 11 is a cause for concern. In the braking system related to the present embodiment, the high μ layer 24B is formed at the outer peripheral portion of the conduction pipe body 24A in each heat conduction pipe 24. For this reason, a decrease in the frictional force in the brake pad body 11 can be suppressed.

Fourth Embodiment

Figure 6:
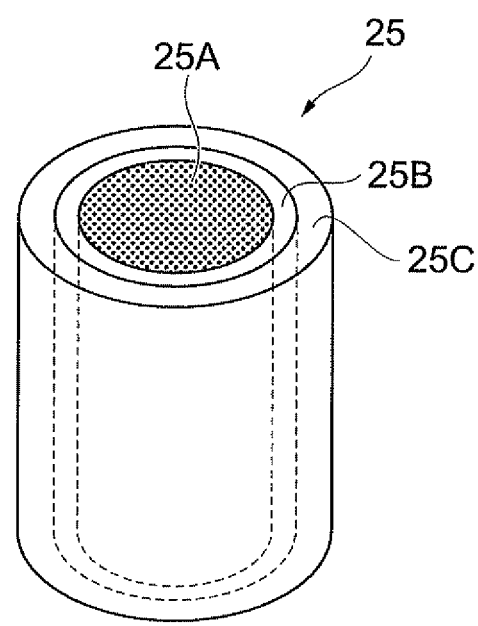
FIG. 6 is a perspective view of a heat conduction pipe used for a braking system related to a fourth embodiment.

Moreover, an attachment aspect of the thermoelectric conversion elements in a fourth embodiment of the invention will be described. The braking system related to the present embodiment is different from the above third embodiment mainly in the configuration of the heat conduction pipe. Thus, the configuration of the heat conduction pipe will be mainly described as the present embodiment. FIG. 6 is a perspective view of the heat conduction pipe used for the braking system related to the present embodiment.

As shown in FIG. 6, a heat conduction pipe 25 provided at a brake pad in the braking system related to the present embodiment includes a conduction pipe body 25A. The outer peripheral portion of the conduction pipe body 25A is formed with a high μ layer 25B, and the outer peripheral portion of the high μ layer 25B is formed with a heat insulating layer 25C. Similarly to the above third embodiment, the conduction pipe body 25A is constituted by the carbon nanotube bundle, and the high μ layer 25B is made of a high μ-property material. Moreover, the heat insulating layer 25C is made of a heat insulating material. As the heat insulating material, for example, ceramic-based resins, aramid-based resins, hydrates that absorb heat at high temperature, and hydrates which emit water of crystallization at high temperature can be illustrated.

In the braking system related to the present embodiment, similarly to the second above embodiment, since the heat conduction pipes 25 are disposed between the sliding surface and the thermoelectric conversion elements 13 in the brake pad body 11, the heat emitted in the heat source can be conducted to the thermoelectric conversion elements 13 at high efficiency. Additionally, since the outer peripheral portion of the conduction pipe body 25A in the heat conduction pipe 25 is formed with the high μ layer 25B, a decrease in the frictional force in the brake pad body 11 can be suppressed.

Moreover, in the braking system related to the present embodiment, the outer peripheral portion of the high μ layer 25B is formed with the heat insulating layer 25C. For this reason, heat can be prevented from being released or diffused toward the outer periphery from the conduction pipe body 25A. As a result, the rate of heat recovery can be made higher, and further improvement in the power generation efficiency can be achieved.

Fifth Embodiment

Subsequently, an attachment aspect of the thermoelectric conversion elements in a fifth embodiment of the invention will be described. FIG. 7A is a plan view of a brake pad in a braking system related to the fifth embodiment, and FIG. 7B is a side sectional view thereof.

As shown in FIGS. 7A and 7B, in the braking system related to the present embodiment, a back metal recess 26 is formed in the surface of the back metal 12 in the brake pad 3 on the side of the brake pad body 11. The back metal recess 26 is provided with a plurality of thermoelectric conversion elements 13. In this way, the thermoelectric conversion elements 13 are provided inside the back metal 12. As shown in FIG. 7A, the plurality of thermoelectric conversion elements 13 is disposed in a matrix in plan view. In the plurality of thermoelectric conversion elements 13, voids 27 are formed between the thermoelectric conversion elements 13.

In the braking system related to the present embodiment, the thermoelectric conversion elements 13 are provided inside the back metal 12. For this reason, the thermoelectric conversion elements 13 can be arranged at positions near the heat source. As a result, the heat recovery efficiency by the thermoelectric conversion elements when the brake is operated can be enhanced, and the power generation efficiency can be improved.

Moreover, in the braking system related to the present embodiment, the thermoelectric conversion elements 13 are provided inside the back metal 12, and the voids 27 are formed between the thermoelectric conversion elements 13. For this reason, the short-circuiting of a base in a case where damage or submersion of the thermoelectric conversion elements 13 caused by a braking force during braking has occurred or the generation of rust can be prevented.

Sixth Embodiment

Moreover, an attachment aspect of the thermoelectric conversion elements in a sixth embodiment of the invention will be described. FIG. 8A is a side sectional view of a brake pad in a braking system related to the sixth embodiment, and FIG. 8B is an enlarged side sectional view thereof.

As shown in FIG. 8A, the brake pad body 11 of the brake pad 3 in the braking system related to the present embodiment is constituted by a plurality of thermoelectric conversion elements 13. As shown in FIG. 8B, each thermoelectric conversion element 13 includes an n-type semiconductor layer 13N and a p-type semiconductor layer 13P. Additionally, the thermoelectric conversion element 13 includes an insulating layer 13I. Moreover, the thermoelectric conversion element includes a high-temperature-side electrode layer 13H and a low-temperature-side electrode layer 13L.

The low-temperature-side electrode layer 13L is formed on the back surface in the brake pad body 11, and the high-temperature-side electrode layer 13H is formed on the sliding surface in the brake pad body. The n-type semiconductor layer 13N and the p-type semiconductor layer 13P are formed between the low-temperature-side electrode layer 13L and the high-temperature-side electrode layer 13H. In this way, a first layer of the invention in which the low-temperature-side electrode layer 13L, the n-type semiconductor layer 13N, and the high-temperature-side electrode layer 13H are laminated is formed, and a second layer of the invention in which the low-temperature-side electrode layer 13L, the p-type semiconductor layer 13P, and the high-temperature-side electrode layer 13H are laminated is formed. Moreover, the insulating layer 13I is formed between the n-type semiconductor layer 13N and the p-type semiconductor layer 13P. The insulating layer 13I is formed as a cavity.

A plurality of the thermoelectric conversion elements 13 having such a configuration is disposed at a distance with the insulating layer 13I therebetween. The plurality of thermoelectric conversion elements 13 is arranged in a matrix in a state where the brake pad 3 is seen in plan view. Additionally, an insulating material, for example, SiC, is thermally sprayed onto the joining surface of the brake pad body 11 in the back metal 12. As the insulating material is formed on the joining surface of the brake pad body 11 in the back metal 12, the thermoelectric conversion elements 13 are fixed with the back metal 12 as a substrate.

In the braking system related to the present embodiment, the thermoelectric conversion elements 13 are provided inside the brake pad body 11. For this reason, the thermoelectric conversion elements 13 can be arranged at positions nearer the heat source. As a result, the heat recovery efficiency by the thermoelectric conversion elements when the brake is operated can be enhanced, and the power generation efficiency can be improved.

Seventh Embodiment

Subsequently, an attachment aspect of the thermoelectric conversion elements in a seventh embodiment of the invention will be described. FIG. 9A is a side sectional view of a brake pad in a braking system related to the seventh embodiment, and FIG. 9B is an enlarged side sectional view thereof.

As shown in FIGS. 9A and 9B, the braking system related to the present embodiment is different from the above sixth embodiment in the aspect of the insulating layer 13I. The other configurations are the same as those of the above sixth embodiment. As shown in FIG. 9B, each thermoelectric conversion element 13 includes an n-type semiconductor layer 13N and a p-type semiconductor layer 13P. Additionally, the thermoelectric conversion elements 13 include the high-temperature-side electrode layer 13H and the low-temperature-side electrode layer 13L.

Moreover, a plurality of thermoelectric conversion elements 13 is arranged in a matrix in a state where the brake pad 3 is seen in plan view. Additionally, the insulating material is thermally sprayed and formed on the joining surface of the brake pad body 11 in the back metal 12, and the thermoelectric conversion elements 13 are fixed with the back metal 12 as a substrate.

On the other hand, in the present embodiment, the insulating layer 13I is filled and formed with a reinforcing material compounding agent in which a reinforcing material is compounded. Moreover, a material having a low thermal conductivity is used as the reinforcing material. Here, as the reinforcing material, for example, polymeric insulators, such as such as metal oxides (ceramics) and polyethylene epoxy which have an insulation action, can be appropriately used.

In the braking system related to the present embodiment, the insulating layer 13I is filled with the reinforcing material compounding agent. Thereby, the thermoelectric conversion elements can be prevented from being damaged due to compression, a shear force, or the like which is generated during braking. Moreover, the rate of heat recovery can be made higher by using a material with a low thermal conductivity as the reinforcing material.

Eighth Embodiment

Moreover, an attachment aspect of the thermoelectric conversion elements in an eighth embodiment of the invention will be described. FIG. 10A is a side sectional view of a brake pad in a braking system related to the eighth embodiment, and FIG. 10B is an enlarged side sectional view thereof.

As shown in FIGS. 10A and 10B, similarly to the above sixth embodiment, the brake pad body 11 is constituted by a plurality of thermoelectric conversion elements 13. As shown in FIG. 10B, similarly to the above sixth above embodiment, each thermoelectric conversion element 13 includes an n-type semiconductor layer 13N and a p-type semiconductor layer 13P. Additionally, the thermoelectric conversion element 13 includes an insulating layer 13I. Moreover, the thermoelectric conversion element 13 includes a high-temperature-side electrode layer 13H and a low-temperature-side electrode layer 13L.

The low-temperature-side electrode layer 13L is formed on the back surface in the brake pad body 11, and the n-type semiconductor layer 13N or the p-type semiconductor layer 13P is formed on the sliding-surface side in the low-temperature-side electrode layer 13L. In this way, a first layer of the invention in which the low-temperature-side electrode layer 13L and the n-type semiconductor layer 13N are laminated is formed, and a second layer of the invention in which the low-temperature-side electrode layer 13L and the p-type semiconductor layer 13P are laminated is formed.

Additionally, both the n-type semiconductor layer 13N and the p-type semiconductor layer 13P are exposed to the sliding-surface side in the brake pad body 11. Moreover, the insulating layer 13I is formed between n-type semiconductor layer 13N and the p-type semiconductor layer 13P, and the high-temperature-side electrode layer 13H is formed inside the insulating layer 13I. Both insulating layer 13I and the high-temperature-side electrode layer 13H are formed from the back surface in the brake pad body 11 to the sliding surface thereof. Additionally, the high-temperature-side electrode layer 13H electrically connects adjacent n-type semiconductor layer 13N and p-type semiconductor layer 13P in the sliding surface of the brake pad body 11.

A plurality of the thermoelectric conversion elements 13 having such a configuration is disposed in the brake pad body 11. The plurality of thermoelectric conversion elements 13 is arranged in a matrix in a state where the brake pad 3 is seen in plan view. Additionally, an insulating material, for example, SiC, is thermally sprayed onto the joining surface of the brake pad body 11 in the back metal 12. As the insulating material is formed on the joining surface of the brake pad body 11 in the back metal 12, the thermoelectric conversion elements 13 are fixed with the back metal 12 as a substrate.

Moreover, the hardness of the n-type semiconductor layer 13N and the p-type semiconductor layer 13P is made equal to or more than the hardness of the electrode layers 13L and 13H, and the hardness of the insulating layer 13I is made smaller than the hardness of the electrode layers 13I, and 13H, and has the following relationship.

Hardness of Semiconductor Layers 13N and 13P)≥(Hardness of Electrode Layers L13 and 13H)>Hardness of Insulating Layer 13I In the braking system related to the present embodiment, the n-type semiconductor layer 13N and the p-type semiconductor layer 13P are electrically connected by the high-temperature-side electrode layer 13H in the sliding surface in the brake pad body 11. For this reason, the heat recovery efficiency can be made high. Additionally, as the high-temperature-side electrode layer 13H is exposed to the sliding-surface side, the high-temperature-side electrode layer 13H is shaved off by the friction between the rotor 1 and the brake pads 3, and the dust of the high-temperature-side electrode layer 13H adheres to the sliding surface of the brake pad body 11. Here, both the n-type semiconductor layer 13N and the p-type semiconductor layer 13P are exposed to the sliding-surface side in the brake pad body 11. For this reason, the n-type semiconductor layer 13N and the p-type semiconductor layer 13P are electrically connected by the dust of the high-temperature-side electrode layer 13H which has been shaved off. For this reason, the area of the high-temperature-side electrode layer 13H exposed to the sliding-surface side of the brake pad body 11 can be made small.

Ninth Embodiment

Figure 11:
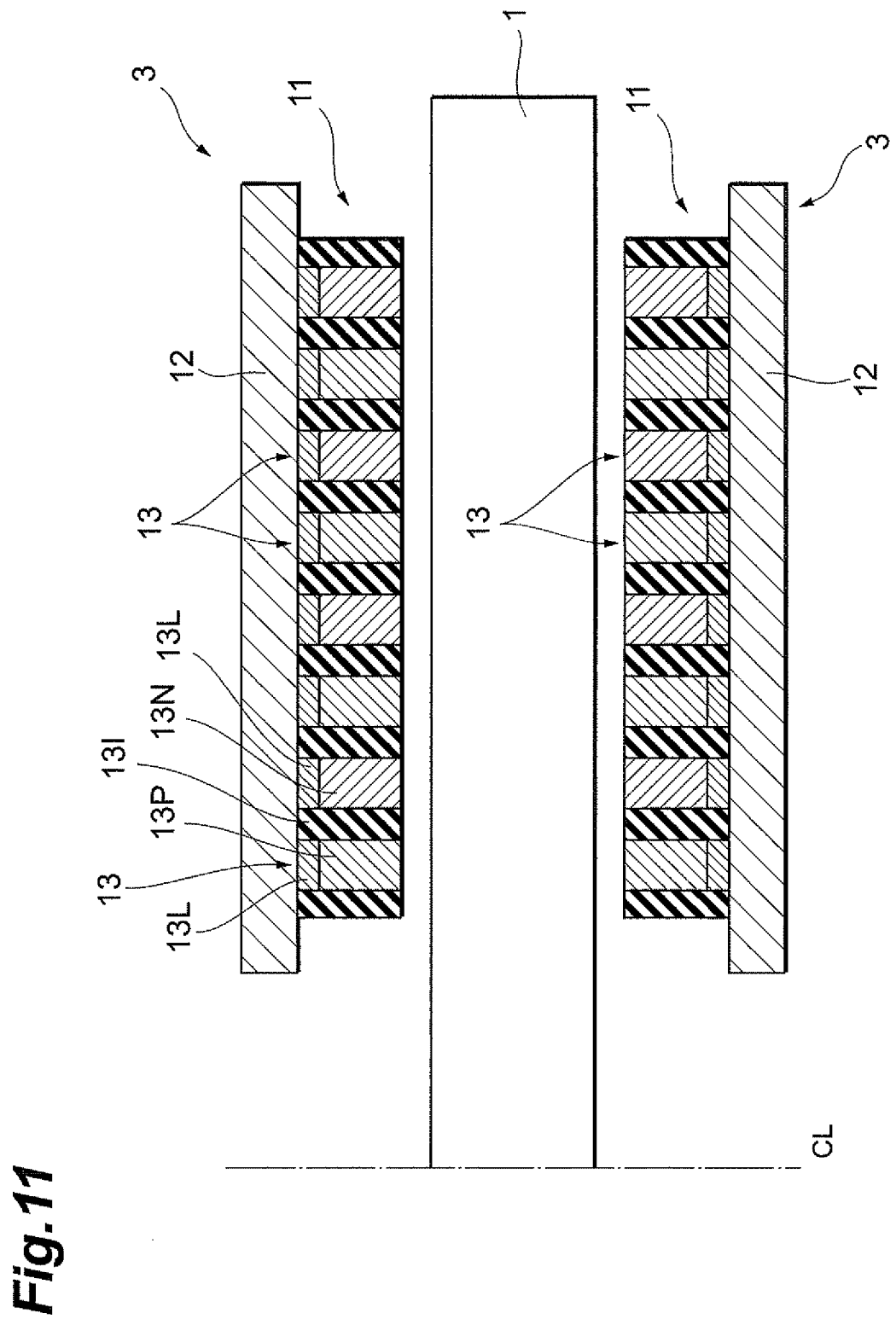
FIG. 11 is a side sectional view of principal parts of a braking system related to a ninth embodiment.

Subsequently, a ninth embodiment of the invention will be described. FIG. 11 is a side sectional view of principal parts of the braking system related to a ninth embodiment. As shown in FIG. 11, in the braking system related to the present embodiment, a metallic member having an energizing property is used as the rotor 1. Additionally, the same brake pad body as one in which the high-temperature-side electrode is removed from the brake pad body in the braking system related to the seventh embodiment shown in FIGS. 9A and 9B is used as the brake pad body 11 in the brake pad 3.

The brake pad body 11 related to the present embodiment is constituted by a plurality of thermoelectric conversion elements 13, and each thermoelectric conversion element 13 includes an n-type semiconductor layer 13N and a p-type semiconductor layer 13P. Additionally, the thermoelectric conversion elements 13 includes the insulating layer 13I and the low-temperature-side electrode layer 13L. The low-temperature-side electrode layer 13L is formed on the back surface in the brake pad body 11, and the n-type semiconductor layer 13N and the p-type semiconductor layer 13P are formed between the low-temperature-side electrode layer 13L and the rotor 1. Moreover, the insulating layer 13I is formed between the n-type semiconductor layer 13N and the p-type semiconductor layer 13P. Additionally, the insulating layer 13I is filled with a reinforcing material compounding agent, similarly to the above eighth embodiment.

In the braking system related to the present embodiment having such a configuration, the rotor 1 functions as a high-temperature-side electrode. Therefore, as compared to the above eighth embodiment, it becomes unnecessary to provide the pad portion with the high-temperature-side electrode. For this reason, as compared to the braking system related to the above eighth embodiment, the structure of the brake pad 3 can be made simple. In addition, in the braking system related to the present embodiment, the insulating layer 13I is filled with the reinforcing material compounding agent. However, it is possible to adopt an aspect in which a cavity is used as the insulating layer 13I.

Tenth Embodiment

Figure 12:
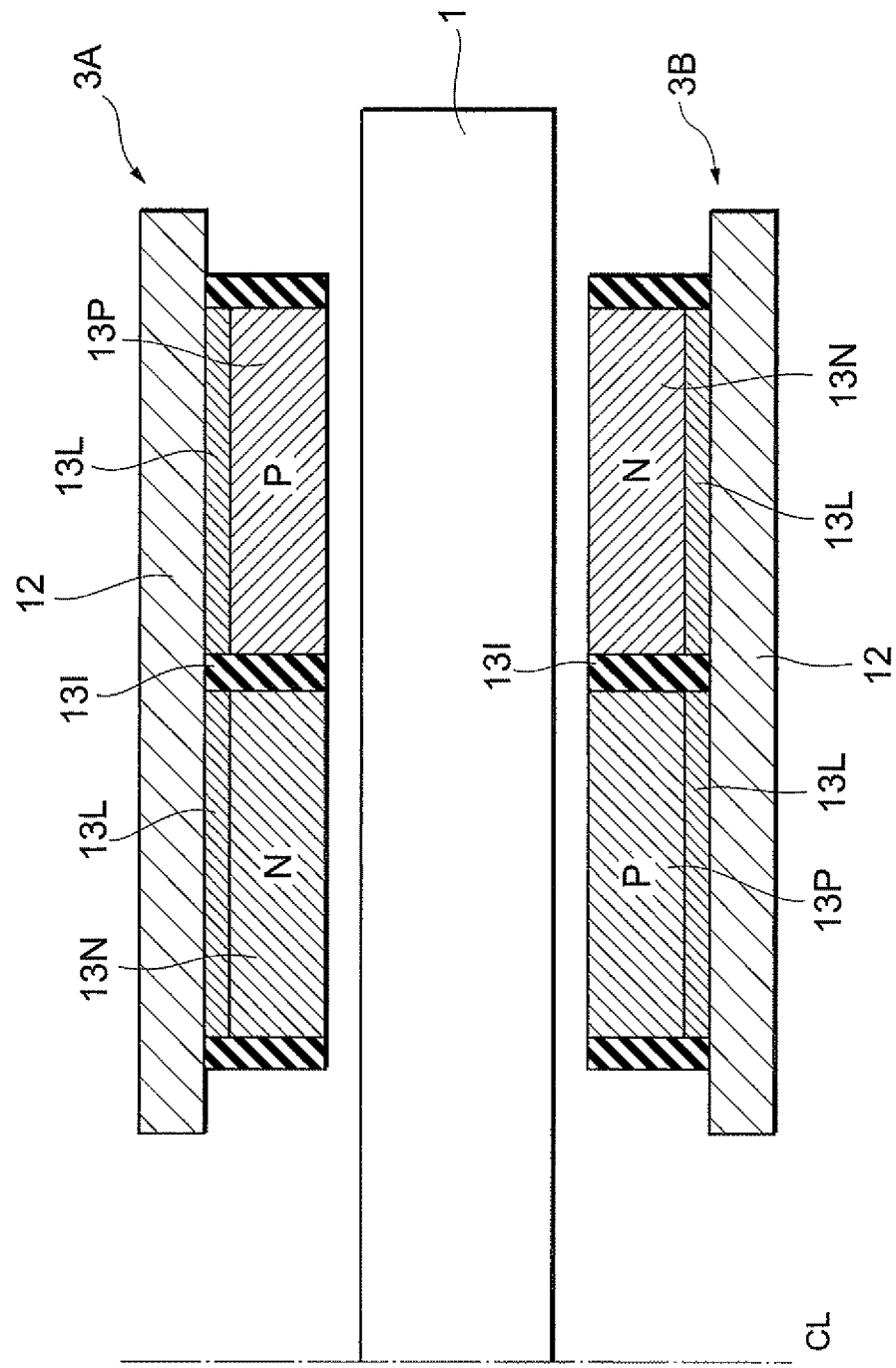
FIG. 12 is a sectional view of principal parts of a braking system related to a tenth embodiment.

Next, a tenth embodiment of the invention will be described. FIG. 12 is a side sectional view of principal parts of a braking system related to a tenth embodiment. As shown in FIG. 12, in the braking system related to the present embodiment, a pair of first brake pad 3A and second brake pad 3B is disposed in the state of facing each other with the rotor 1 therebetween. An n-type semiconductor layer 13N and a p-type semiconductor layer 13P are provided in both the first brake pad 3A and the second brake pad 3B. Additionally, the insulating layer 13I is formed between the n-type semiconductor layer 13N and the p-type semiconductor layer 13P, and the low-temperature-side electrode layer 13L is formed on the back surface in the brake pad body 11. Moreover, the high-temperature-side electrode layer 13H is provided on the surface of the insulating layer 13I on the side of the rotor 1. The high-temperature-side electrode layer 13H electrically connects the n-type semiconductor layer 13N and the p-type semiconductor layer 13P.

Moreover, both the n-type semiconductor layer 13N in the first brake pad 3A and the p-type semiconductor layer 13P in the second brake pad 3B, and the p-type semiconductor layer 13P in the first brake pad 3A and the n-type semiconductor layer 13N in the second brake pad 3B are arranged at positions where the layers face each other with the rotor 1 therebetween.

In the n-type semiconductor layer 13N and the p-type semiconductor layer 13P, the frictional resistance when sliding on the rotor 1 may be different due to a difference in the materials of the layers. For this reason, when the n-type semiconductor layers 13N face each other and the p-type semiconductor layers 13P face each other, between the first brake pad 3A and the second brake pad 3B, the frictional resistance between the n-type semiconductor layers 13N and between will be different from each other. Due to the difference in the frictional resistance, problems occur in that partial wear of the brake pads 3A and 3B occurs or deterioration of brake balance is caused.

In this regard, in the braking system related to the present embodiment, both the n-type semiconductor layer 13N in the first brake pad 3A and the p-type semiconductor layer 13P in the second brake pad 3B, and the p-type semiconductor layer 13P in the first brake pad 3A and the n-type semiconductor layer 13N in the second brake pad 3B are arranged at positions where the layers face each other with the rotor 1 therebetween. For this reason, since the frictional resistance becomes equal between the first brake pad 3A and the second brake pad 3B, the occurrence of problems, such as partial wear of the brake pads 3A and 3B, and deterioration of brake balance, can be avoided.

In addition, in the braking system related to the present embodiment, the high-temperature-side electrode layer 13H is provided in the surface of the insulating layer 13I of the first brake pad 3A on the side of the rotor 1. However, it is also possible to adopt an aspect in which the rotor 1 is used as the high-temperature-side electrode without providing the high-temperature-side electrode layer 13H. In this case, a rotor made of, for example, a metallic material having an energizing property is used as the rotor 1.

Eleventh Embodiment

Figure 13:
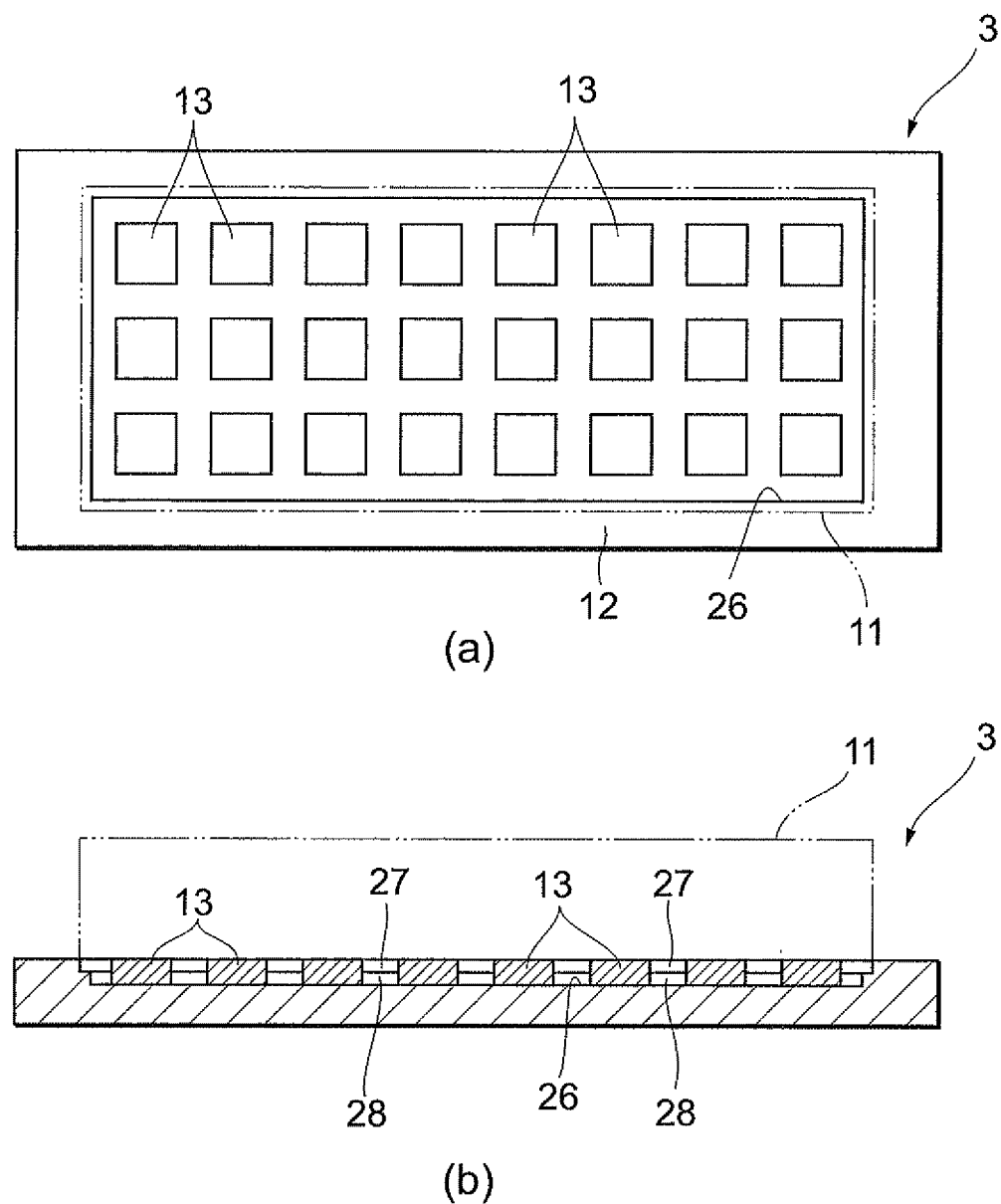
FIG. 13A is a plan view of a brake pad in a braking system related to an eleventh embodiment.
FIG. 13B is a side sectional view thereof.

Subsequently, an eleventh embodiment of the invention will be described. FIG. 13A is a plan view of a brake pad in a braking system related to the eleventh embodiment, and FIG. 13B is a side sectional view thereof. As shown in FIGS. 13A and 13B, in the braking system related to the present embodiment, similarly to the above fifth embodiment, a back metal recess 26 is formed in the surface of the back metal 12 in the brake pad 3 on the side of the brake pad body 11, and a plurality of thermoelectric conversion elements 13 are provided in the back metal recess 26. Additionally, as shown in FIG. 7B, the plurality of thermoelectric conversion elements 13 is disposed in a matrix in plan view. In the plurality of thermoelectric conversion elements 13, voids 27 are formed between the thermoelectric conversion elements 13.

Moreover, air-cooling grooves 28 are formed in parts where the voids 27 are formed so as to become one-step lower than the surface to which the thermoelectric conversion elements 13 are attached. The air-cooling grooves 28 become refrigerant channels, and are formed so as to overlap positions in which the voids 27 are formed. Air used as a refrigerant is allowed to circulate through the air-cooling grooves 28. Additionally, air is also allowed to circulate through the voids 27, and the voids 27 also function as the refrigerant channels.

In the braking system related to the present embodiment, the air-cooling grooves 28 are formed so as to overlap the voids 27. Therefore, the thermoelectric conversion elements 13 can be appropriately cooled. By cooling the thermoelectric conversion elements 13, a temperature difference between a heat source which generates heat when each brake pad 3 slides on the rotor 1, and the thermoelectric conversion elements 13 can be increased. As a result, the power generation efficiency of the thermoelectric conversion elements 13 can be made higher.

Twelfth Embodiment

Figure 14:
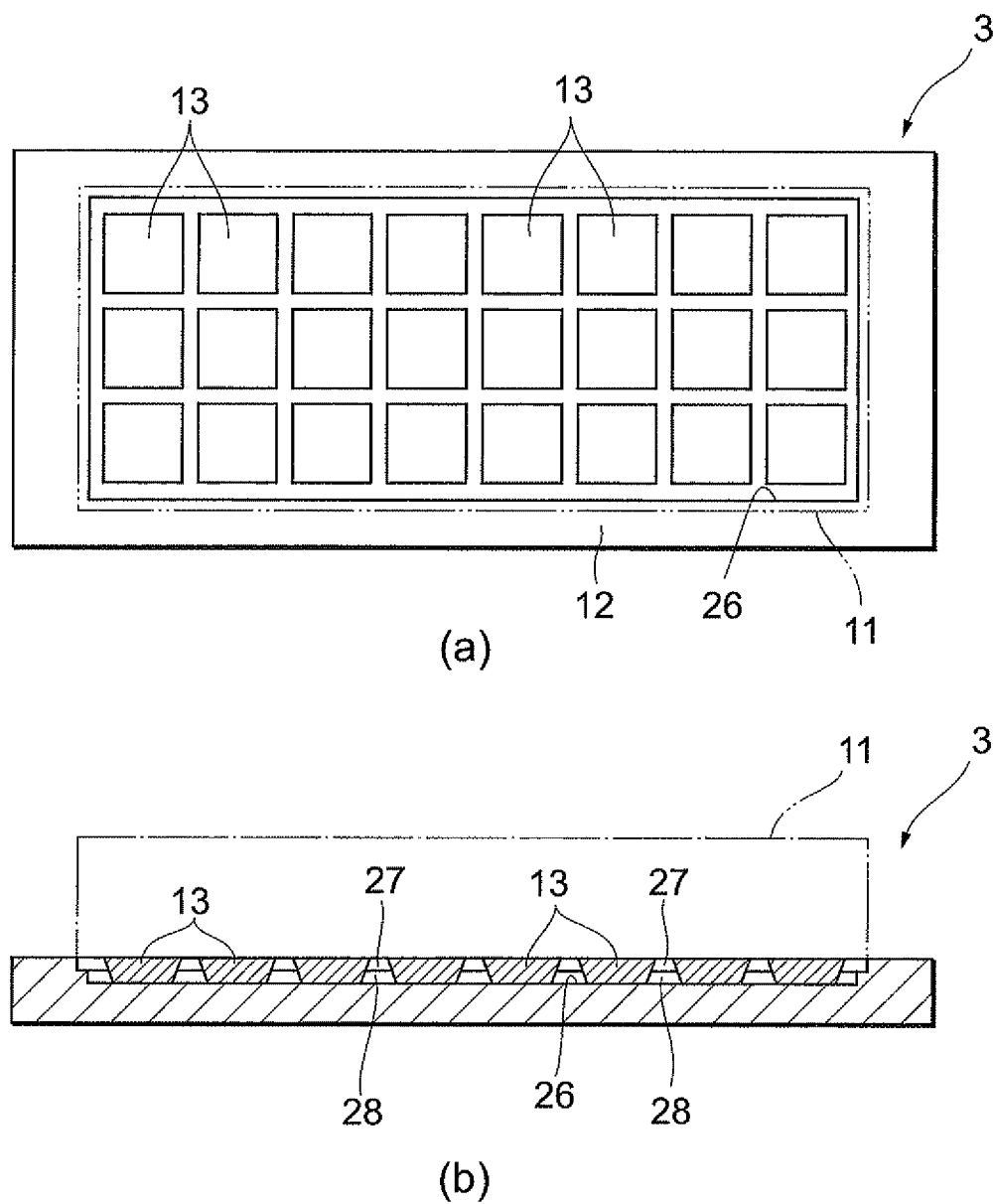
FIG. 14A is a plan view of a brake pad in a braking system related to a twelfth embodiment.
FIG. 14B is a side sectional view thereof.

Next, a twelfth embodiment of the invention will be described. FIG. 14A is a plan view of a brake pad in a braking system related to the twelfth embodiment, and FIG. 14B is a side sectional view thereof. As shown in FIG. 14, in the braking system related to the present embodiment, similarly to the above eleventh embodiment, a back metal recess 26 is formed in the surface of the back metal 12 in the brake pad 3 on the side of the brake pad body 11, and a plurality of thermoelectric conversion elements 13 are provided in the back metal recess 26. Additionally, as shown in FIG. 14A, the plurality of thermoelectric conversion elements 13 is disposed in a matrix in plan view. In the plurality of thermoelectric conversion elements 13, voids 27 are formed between the thermoelectric conversion elements 13.

Moreover, the shape of each thermoelectric conversion element 13 when the brake pad body 11 is seen in side view is a trapezoidal shape such that the upper side is longer than the lower side, and is a tapered shape whose diameter is reduced toward the back metal 12 side from the brake pad body 11 side. Moreover, the shape of each void 27 when the brake pad body 11 is seen in side view is a trapezoidal shape such that the upper side is shorter than the lower side, and is a tapered shape whose diameter is increased toward the back metal 12 side from the brake pad body 11 side. In this way, the thermoelectric conversion element 13 has a tapered shape whose diameter is reduced toward the back metal 12 side from the brake pad body 11 side. Thereby, the area of the portions of the thermoelectric conversion elements 13 which receive heat generated when the brake pad 3 slides on the rotor 1 can be increased. For this reason, the heat recovery efficiency can be made higher.

Thirteenth Embodiment

Subsequently, a thirteenth embodiment of the invention will be described. FIG. 15A is a plan view of a brake pad in a braking system related to the thirteenth embodiment, and FIG. 15B is a side sectional view thereof. As shown in FIGS. 15A and 15B, the braking system related to the present embodiment is different from the above eleventh embodiment in that a heat insulating layer 29 is formed in the part where the voids 27 and the air-cooling grooves 28 are formed.

The other points are made to be the same as those of the above eleventh embodiment. The heat insulating layer 29 is made of a heat insulating material having an insulation property. As the heat insulating layer 29 is formed, the thermoelectric conversion elements 13 are brought into a state of being covered with an insulating material having an insulation property.

In the braking system related to the present embodiment, the heat insulating layer 29 is formed between a plurality of thermoelectric conversion elements 13, and the thermoelectric conversion elements 13 are covered with an insulating material having an insulation property. For this reason, diffusion or heat dissipation of the heat from the thermoelectric conversion elements 13 can be suppressed. Accordingly, the heat recovery efficiency can be made higher, and the power generation efficiency of the thermoelectric conversion elements 13 can be made higher.

Fourteenth Embodiment

Figure 16:
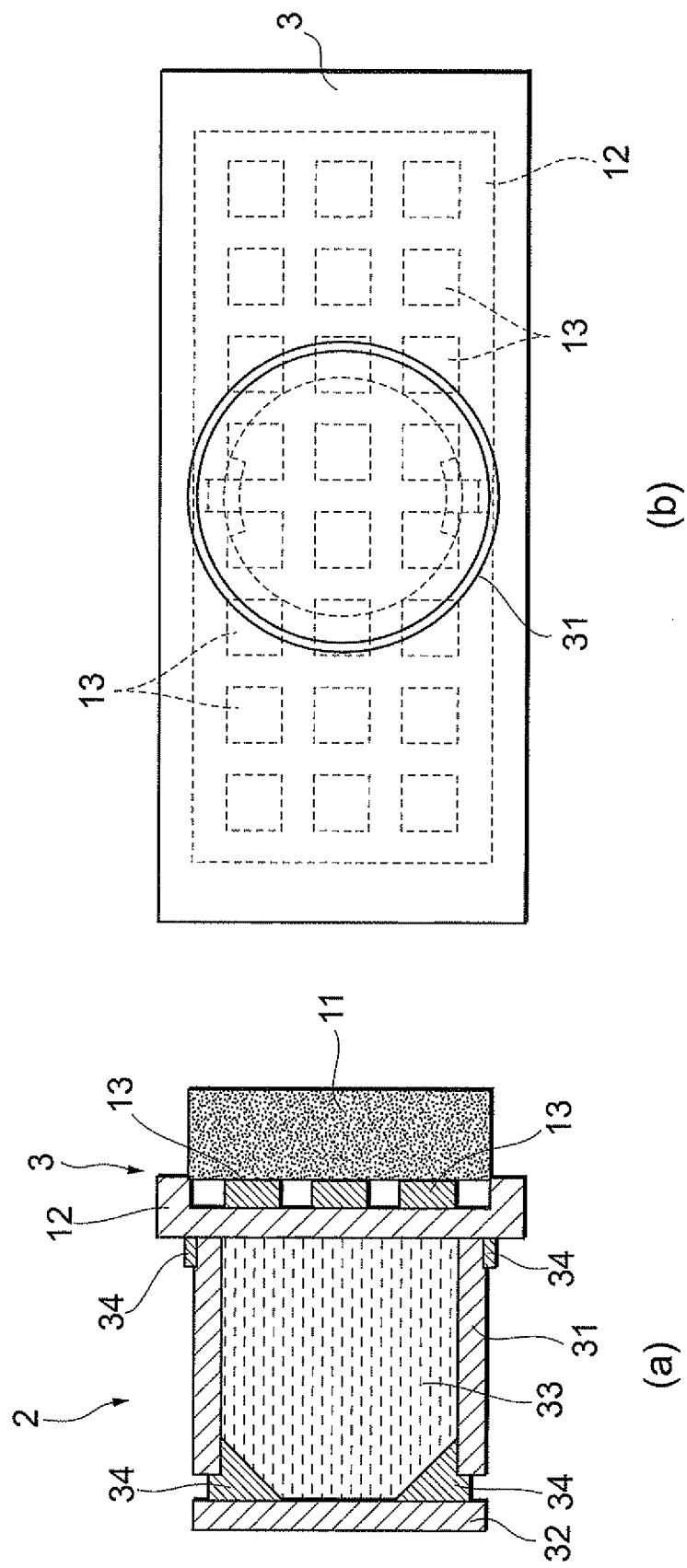
FIG. 16A is a front sectional view of principal parts of a braking system related to a fourteenth embodiment.
FIG. 16B is a plan view thereof.

Moreover, a fourteenth embodiment of the invention will be described. FIG. 16A is a front sectional view of principal parts of a braking system related to the fourteenth embodiment, and FIG. 16B is a plan view thereof. As shown in FIG. 16, the braking system related to the present embodiment is different from the above eleventh embodiment mainly in the configuration of the brake caliper 2, and includes the same configuration in terms of other points.

As shown in FIG. 16, in the braking system related to the present embodiment, a piston member 31, which is a movable member in the brake caliper 2, is provided on the side of the back metal 12 of the brake pad 3, which is opposite to the side which the brake pad body 11 is formed. A back plate 32 is attached to the side of the piston member 31 opposite to the side of the piston member attached to the back metal 12. Moreover, the region surrounded by the inside of the piston member 31 and the back plate 32 is filled with a heat transfer fluid, for example, water 33, and seal members 34 are respectively provided between the piston member 31 and the back plate 32 and between the piston member 31 and the back metal 12.

In the braking system related to the present embodiment, the piston member 31 is provided in the brake caliper 2 on the side opposite to the side where the brake pad body 11 is formed. For this reason, the thermoelectric conversion elements 13 provided in the brake pad body 11 can be appropriately cooled. As a result, a temperature difference between a heat source which generates heat when each brake pad 3 slides on the rotor 1, and the thermoelectric conversion elements 13 can be increased. As a result, the power generation efficiency of the thermoelectric conversion elements 13 can be made higher.

Fifteenth Embodiment

Subsequently, a fifteenth embodiment of the invention will be described. FIG. 17A is a front sectional view of a rotor in a braking system related to the fifteenth embodiment of the invention, and FIG. 17B is a plan sectional view thereof. In the braking system related to the present embodiment, the brake pad 3 or the like is not provided with the thermoelectric conversion elements, and the rotor 1 is provided with the thermoelectric conversion elements. As shown in FIGS. 17A and 17B, in the braking system related to the present embodiment, the rotor 1 is provided with a first thermoelectric conversion element 41A and a second thermoelectric conversion element 41B. Both the first thermoelectric conversion element 41A and the second thermoelectric conversion element 41B have an n-type semiconductor element 41N and a p-type semiconductor element 41P.

The shape of both the n-type semiconductor element 41N and the p-type semiconductor element 41P in front view is a shape (hereinafter referred to as a "sector cut-out shape") obtained by cutting out a sector shape slightly smaller than a large sector shape. Here, the diameter of the large sector shape is made to be approximately equal to the diameter of the rotor 1. Additionally, both the large sector shape and the small sector shape have a central angle of about 90°.

Moreover, in the rotor 1, two n-type semiconductor elements 41N and two p-type semiconductor elements 41P are disposed along the circumferential direction of the rotor 1. Insulating layers 41I are respectively formed between the plurality of n-type semiconductor elements 41N and p-type semiconductor elements 41P. In this way, both the first thermoelectric conversion element 41A and the second thermoelectric conversion element 41B are formed by two n-type semiconductor elements 41N, two p-type semiconductor elements 41P, and four insulating layers 41I.

Additionally, a disc-shaped insulating member 42 is disposed between the two first thermoelectric conversion element 41A and second thermoelectric conversion element 41B, and the first thermoelectric conversion element 41A and the second thermoelectric conversion element 41B are insulated by an insulating member 42. When the rotor 1 is seen in front view, the n-type semiconductor elements 41N in the first thermoelectric conversion element 41A and the p-type semiconductor elements 41P in the second thermoelectric conversion element 41B are arranged at mutually overlapping positions. In this way, the n-type semiconductor elements 41N and the p-type semiconductor elements 41P are disposed alternately along the circumferential direction of the rotor 1, and the insulating layers 41I are formed between the p-type semiconductor element 41P and the n-type semiconductor layer N.

Moreover, friction plates 43 are respectively provided outside the first thermoelectric conversion element 41A in the rotor 1 and outside the second thermoelectric conversion element 41B. The friction plates 43, the first thermoelectric conversion element 41A, the insulating member 42, and the second thermoelectric conversion element 41B are fastened together by pin-shaped fastening members 44. In this way, the disc-shaped rotor 1 is formed by the friction plates 43, the first thermoelectric conversion element 41A, the insulating member 42, and the second thermoelectric conversion element 41B.

Additionally, slip rings (not shown) are respectively provided outside the first thermoelectric conversion element 41A and the second thermoelectric conversion element 41B. Thus, the n-type semiconductor elements 41N and the n-type semiconductor elements 41N in the first thermoelectric conversion element 41A are electrically connected, respectively. Similarly, the n-type semiconductor elements 41N and the n-type semiconductor elements 41N in the second thermoelectric conversion element 41B are electrically connected, respectively, by the slip rings. According to this aspect, in the rotor 1, as schematically shown in FIG. 18, the n-type semiconductor elements 41N and the p-type semiconductor elements 41P are electrically connected, respectively.

In the braking system related to the present embodiment, the rotor 1 is provided with thermoelectric conversion element 41. For this reason, the thermoelectric conversion elements 41 can be arranged at positions near a heat source which generates heat when the brake pad 3 slides on the rotor 1. Therefore, the heat recovery efficiency can be made higher.

Moreover, in the braking system related to the present embodiment, the n-type semiconductor elements 41N and the p-type semiconductor element 41P are disposed alternately along the circumferential direction of the rotor 1. For this reason, since the frictional resistance in the brake pad 3 becomes equal in the circumferential direction of the rotor 1, the occurrence of problems, such as partial wear of the brake pad, and deterioration of brake balance, can be avoided.

INDUSTRIAL APPLICABILITY

The present invention relates to a braking system, and particularly, can be used for a braking system which can convert the heat obtained from the braking system into electricity appropriately.

The invention claimed is:

1. A braking system comprising:
a rotor member attached to a rotating body;
a sliding member which brakes a rotation of the rotating body via the rotor member as the sliding member is brought into sliding contact with the rotor member; and
a movable member which moves the sliding member in a direction of the rotor member, wherein:
the sliding member includes a sliding member body which comes into contact with the rotor member, and an interposing member which attaches the sliding member body to the movable member;
a thermoelectric conversion element is arranged on an interposing member side in the sliding member body;
a heat transfer member is provided between a surface of the sliding member body on a side of the rotor member, and the thermoelectric conversion element;
the sliding member body is formed with a space for disposing the heat transfer member;
an outer peripheral portion of the heat transfer member is formed with a layer made of metal oxide; and
the heat transfer member formed with the layer made of metal oxide is disposed in the space.

2. The braking system according to claim 1, wherein the heat transfer member is a carbon nanotube.

3. The braking system according to claim 1, wherein:
the outer peripheral portion of the heat transfer member is formed with a heat insulating material layer; and
the heat transfer member formed with the heat insulating material layer is disposed in the space.

* * * * *